(12) United States Patent
Buford et al.

(10) Patent No.: US 11,683,939 B2
(45) Date of Patent: Jun. 20, 2023

(54) SPIN ORBIT MEMORY DEVICES WITH DUAL ELECTRODES, AND METHODS OF FABRICATION

(71) Applicant: Intel Corporation, Santa Clara, CA (US)

(72) Inventors: Benjamin Buford, Hillsboro, OR (US); Angeline Smith, Hillsboro, OR (US); Noriyuki Sato, Hillsboro, OR (US); Tanay Gosavi, Hillsboro, OR (US); Kaan Oguz, Portland, OR (US); Christopher Wiegand, Portland, OR (US); Kevin O'Brien, Portland, OR (US); Tofizur Rahman, Portland, OR (US); Gary Allen, Portland, OR (US); Sasikanth Manipatruni, Portland, OR (US); Emily Walker, Santa Clara, CA (US)

(73) Assignee: INTEL CORPORATION, Santa Clara, CA (US)

( * ) Notice: Subject to any disclaimer, the term of this patent is extended or adjusted under 35 U.S.C. 154(b) by 906 days.

(21) Appl. No.: 16/396,451

(22) Filed: Apr. 26, 2019

(65) Prior Publication Data
US 2020/0343301 A1   Oct. 29, 2020

(51) Int. Cl.
| H10B 61/00 | (2023.01) |
| H10N 50/10 | (2023.01) |
| H10N 52/00 | (2023.01) |
| H10N 52/01 | (2023.01) |
| H10N 52/80 | (2023.01) |

(52) U.S. Cl.
CPC ............. *H10B 61/22* (2023.02); *H10N 50/10* (2023.02); *H10N 52/00* (2023.02); *H10N 52/01* (2023.02); *H10N 52/80* (2023.02)

(58) Field of Classification Search
CPC ....................................................... H01L 43/04
See application file for complete search history.

(56) References Cited

U.S. PATENT DOCUMENTS

| 9,490,297 | B1 * | 11/2016 | Braganca ................ H01L 43/08 |
| 10,453,511 | B2 * | 10/2019 | Lua ..................... G11C 11/1693 |
| 2016/0267961 | A1 * | 9/2016 | Lee ........................ H01L 43/02 |
| 2017/0092844 | A1 * | 3/2017 | Braganca .............. G11C 11/161 |
| 2018/0151210 | A1 * | 5/2018 | Li ........................... H01L 43/02 |
| 2019/0304523 | A1 * | 10/2019 | O'Brien ................ G11C 11/161 |
| 2019/0304524 | A1 * | 10/2019 | Oguz ..................... H01L 43/02 |

(Continued)

*Primary Examiner* — Caleb E Henry
(74) *Attorney, Agent, or Firm* — Finch & Maloney PLLC

(57) ABSTRACT

A memory apparatus includes a first electrode having a spin orbit material. The memory apparatus further includes a first memory device on a portion of the first electrode and a first dielectric adjacent to a sidewall of the first memory device. The memory apparatus further includes a second memory device on a portion of the first electrode and a second dielectric adjacent to a sidewall of the second memory device. A second electrode is on and in contact with a portion of the first electrode, where the second electrode is between the first memory device and the second memory device. The second electrode has a lower electrical resistance than an electrical resistance of the first electrode. The memory apparatus further includes a first interconnect structure and a second interconnect, each coupled with the first electrode.

20 Claims, 16 Drawing Sheets

(56) References Cited

U.S. PATENT DOCUMENTS

| | | | |
|---|---|---|---|
| 2019/0304653 A1* | 10/2019 | Oguz | H01L 27/228 |
| 2019/0305042 A1* | 10/2019 | Chen | G11C 11/1673 |
| 2019/0326353 A1* | 10/2019 | O'Brien | G11C 11/161 |
| 2020/0006630 A1* | 1/2020 | Sato | G11C 11/161 |
| 2020/0083429 A1* | 3/2020 | Lee | H01L 27/228 |

\* cited by examiner

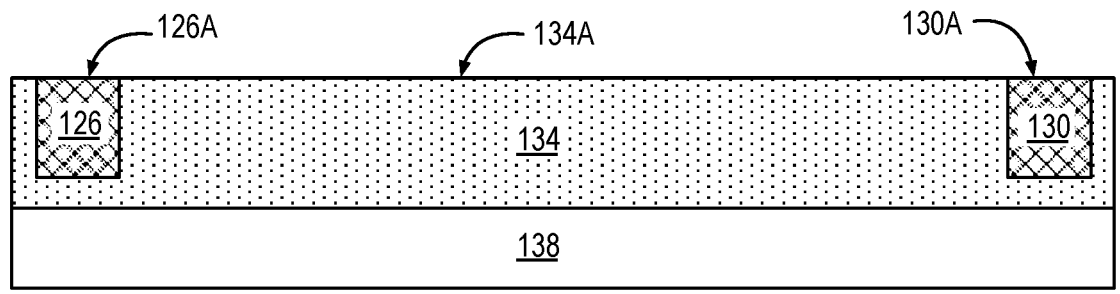
FIG. 6A
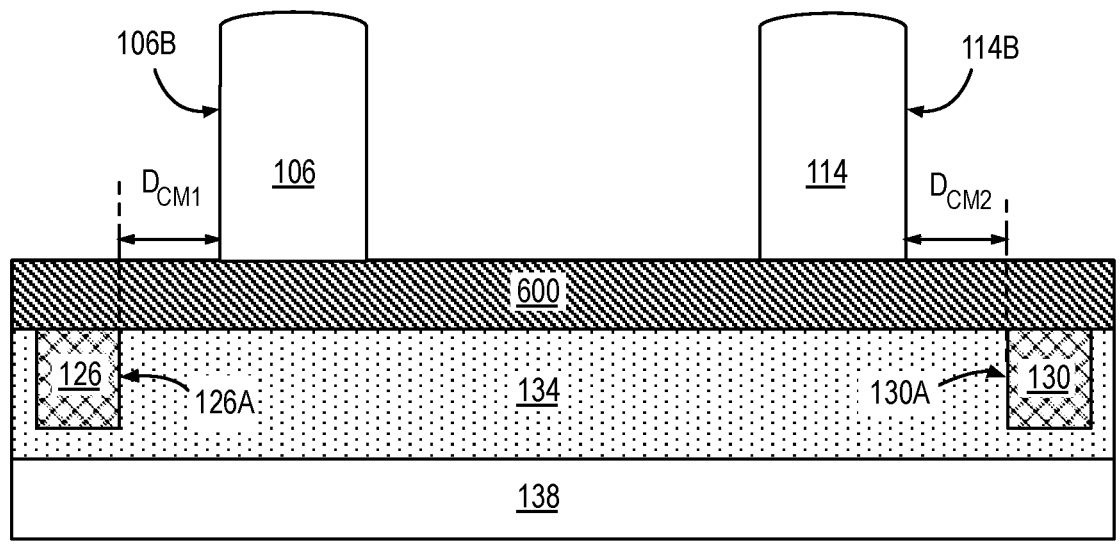
FIG. 6B
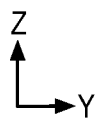

SPIN ORBIT MEMORY DEVICES WITH DUAL ELECTRODES, AND METHODS OF FABRICATION

BACKGROUND

For the past several decades, the scaling of features in integrated circuits has been a driving force behind an ever-growing semiconductor industry. Scaling to smaller and smaller features enables increased densities of functional units on limited real estate of semiconductor chips. For example, shrinking transistor size allows for the incorporation of an increased number of memory devices on a chip, lending to the fabrication of products with increased functionality. The drive for ever-more functionality, however, is not without issue. It has become increasingly significant to rely on innovative devices such as spin orbit memory devices including a spin orbit electrode coupled with a compatible Magnetic Tunnel Junction (MTJ) device to overcome the requirements imposed by scaling.

Non-volatile embedded memory with spin orbit memory devices, e.g., on-chip embedded memory with non-volatility can enable energy and computational efficiency. However, the technical challenges of assembling a plurality of MTJ elements on a single SOT electrode presents formidable roadblocks to commercialization of this technology today. Specifically, assembling a plurality of MTJ elements on a single SOT electrode for operation at low electrical voltages is an important area of device development.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 6A illustrates a cross-sectional view following the formation of a pair of conductive interconnects, in accordance with embodiments of the present disclosure.

FIG. 6B illustrates a cross-sectional view of the structure in FIG. 6A following formation of an electrode layer including a spin orbit material above a pair of conductive interconnects formed adjacent to a first dielectric material, and the formation of a first MTJ and a second MTJ on the electrode layer.

DESCRIPTION OF THE EMBODIMENTS

Figure 1A:
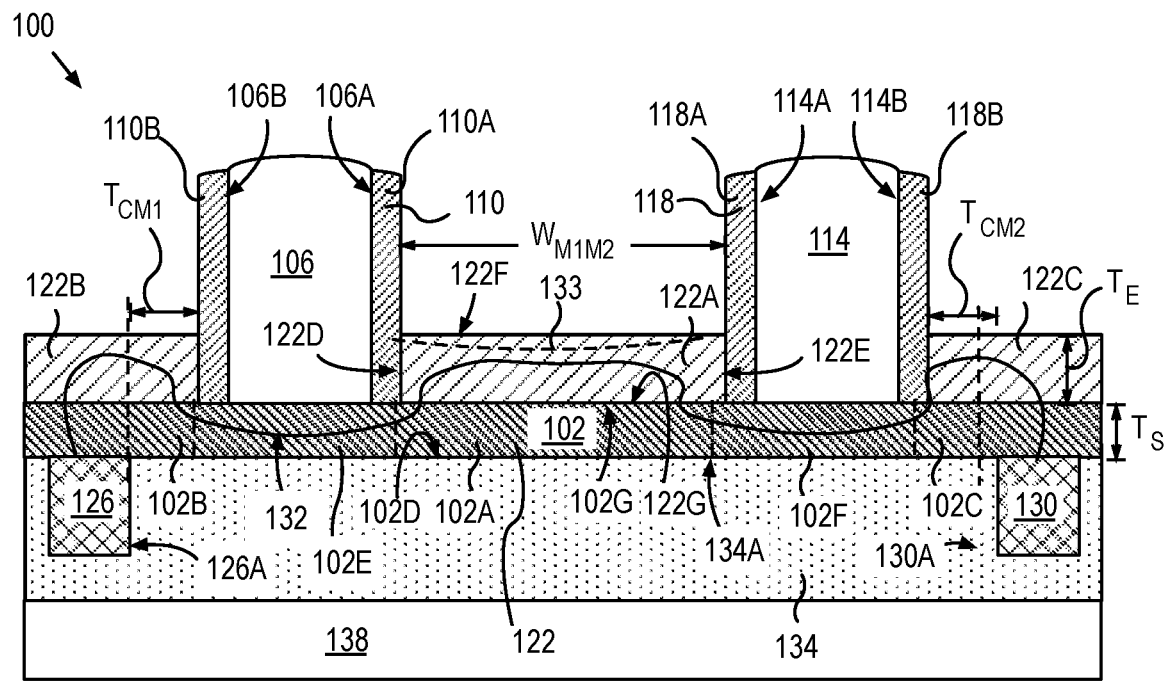
FIG. 1A illustrates a cross-sectional view of a first magnetic tunnel junction (MTJ) and a second MTJ, where the first MTJ and the second MTJ are laterally separated and coupled to a same spin orbit electrode, in accordance with an embodiment of the present disclosure.

Spin orbit memory devices and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, magnetic or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/ material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Here, an in-plane magnet refers to a magnet that has magnetization in a direction substantially along the plane of the magnet. For example, a magnet with a magnetization which is in an x or y direction and is in a range of 0 (or 180 degrees)+/−20 degrees relative to an x-y plane of a device.

The term "free" or "unfixed" here with reference to a magnet refers to a magnet whose magnetization direction can change along its easy axis upon application of an external field or force (e.g., Oersted field, spin torque, etc.). Conversely, the term "fixed" or "pinned" here with reference to a magnet refers to a magnet whose magnetization direction is pinned or fixed along an axis and which may not change due to application of an external field (e.g., electrical field, Oersted field, spin torque).

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +1-10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

A spin orbit memory device may include a magnetic tunnel junction (MTJ) device formed on an electrode including a spin orbit material, herein a spin orbit electrode. The MTJ device functions as a memory device where the resistance of the MTJ device switches between a high resistance state and a low resistance state. The resistance state of an MTJ device is defined by a relative orientation of magnetization between a free magnet and a fixed magnet that are separated by a tunnel barrier. When a magnetization of the free magnet and a magnetization of a fixed magnet have orientations that are in the same direction, the MTJ device is said to be in a low resistance state. Conversely, when the magnetization of the free magnet and a fixed magnet each have orientations that are in opposite direction to each other, the MTJ device is said to be in a high resistance state.

As MTJ devices are scaled, the need for smaller memory elements to fit into a scaled cell size has driven the industry in the direction of perpendicular MTJ (pMTJ). Perpendicular MTJ based memory devices have a fixed magnet and a free magnet each having a magnetic anisotropy that is perpendicular with respect to a plane of an uppermost surface of the free magnet or an uppermost surface of the spin orbit electrode. Resistance switching is brought about in a pMTJ device by passing a critical amount of spin polarized current through the pMTJ device so as to influence the orientation of the magnetization in the free magnet to align with the magnetization in the fixed magnet. The magnetization is influenced by a phenomenon known as spin torque transfer, where torque from the spin polarized current is imparted to the magnetization of the free magnet. When a threshold torque is imparted, the magnetization of the free magnet may change direction. By changing the direction of the current, the direction of magnetization in the free magnet may be reversed relative to the direction of magnetization in the fixed magnet. Since the free magnet does not need a constant source of spin polarized current to maintain a magnetization direction, the resistance state of the pMTJ device is retained even when there is no current flowing through the pMTJ device. For this reason, the pMTJ device belongs to a class of memory devices known as non-volatile memory.

As a pMTJ device is further scaled down in size, the amount of critical spin polarized current density required to switch the device increases. By implementing a pMTJ device on a spin orbit electrode, the magnetization in the free magnet can receive an additional torque from a spin Hall current generated in the spin orbit electrode. The spin Hall current may be generated in the vicinity of the pMTJ device by passing an electrical current in a transverse direction, through the spin orbit electrode. The spin Hall current arises from spin dependent scattering of electrons due to a phenomenon known as spin orbit interaction. Electrons of one spin polarity are directed towards an upper portion of the spin orbit electrode and electrons with an opposite spin polarity are directed toward a bottom portion of the spin orbit electrode. Electrons of a particular spin polarity are diffused toward the free magnet of the pMTJ device and impart a torque on the magnetization of the free magnet. There are benefits of spin Hall current assisted switching through implementation of a single pMTJ device onto a spin orbit electrode. However, it is desirable to implement a plurality of pMTJ devices onto a single spin orbit electrode to enable a high-density memory array.

However, engineering a plurality of perpendicular magnetic tunnel junction devices onto a single spin orbit electrode can be challenging to fabricate and to operate. When two or more MTJ devices are implemented onto a single spin orbit electrode, an effective length of the spin orbit electrode may be increased. When the effective length is increased a larger voltage may be required to drive current that is comparable to current driven through a shorter spin orbit electrode. To utilize benefits of coupling two or more pMTJ devices but operate at sufficiently low voltages (such as voltages substantially close to 1V or less), a conductive electrode may be coupled with portions of the spin orbit electrode but not directly under the pMTJ devices.

The conductive electrode may have a lower electrical resistance than an electrical resistance of the material of the spin orbit electrode. A lower electrical resistance in the conductive electrode may provide an alternative current path above portions of the spin orbit electrode. During operation current will flow through portions of the spin orbit electrode under the pMTJ and through the less resistive conductive electrode away from the pMTJ. When electrical current flows under two or more pMTJs, spin Hall current may be generated under each pMTJ. A reduction in electrical resistance through a combination of the conductive electrode and the spin orbit electrode will require a lower operational voltage to drive a substantially same amount of current. The conductive electrode may have a thickness that depends on the choice of material and on the length.

In accordance with embodiments of the present disclosure, a memory apparatus includes a first electrode with a spin orbit material. The memory apparatus further includes a first memory device on a portion of the first electrode and a first dielectric adjacent to a sidewall of the first memory device and on a portion of the first electrode. The memory apparatus further includes a second memory device on a portion of the first electrode and a second dielectric adjacent to a sidewall of the second memory device and on a portion of the first electrode. The second memory device is laterally spaced from the first memory device along a length of the first electrode. A second electrode is on and in contact with a portion of the first electrode, where the second electrode is between the first memory device and the second memory device. The second electrode comprises a material having a lower electrical resistance than an electrical resistance of the spin orbit material. The memory apparatus further includes a first interconnect structure and a second interconnect, each coupled with the first electrode, where the first memory device and the second memory device are each laterally between the first interconnect structure and the second interconnect structure.

To generate a large spin Hall current, it is desirable for a width (orthogonal to the length) of the first memory device and a width of the second memory device to be substantially equivalent to a width of the first electrode. However, in other embodiments, the width of the first electrode is greater than the width of the first memory device and the width of the second memory device.

The first electrode and the second electrode each have a substantially same width. For example, the second electrode has a lower most surface that is in contact with an uppermost surface of the first electrode. The lower most surface of the second electrode has a width that is substantially the same as the width of the uppermost surface of the first electrode. In embodiments, first electrode and the second electrode each have a width that may be substantially equal to, less than or greater than a width of the first pMTJ device or the second pMTJ device.

FIG. 1A is an illustration of a cross-sectional view of a memory apparatus 100 in accordance with an embodiment of the present disclosure. The memory apparatus 100 includes an electrode 102 having a spin orbit material adjacent to a dielectric 134. The electrode 102 is herein referred to as a spin orbit electrode 102. The memory apparatus 100 further includes a memory device 106 on a portion of the spin orbit electrode 102. A dielectric spacer 110 is adjacent to the memory device 106 and is also on a portion of the spin orbit electrode 102. In the cross-sectional illustration, the dielectric spacer 110 has a portion 110A that is adjacent to sidewall 106A, and a portion 110B that is adjacent to sidewall 106B. The memory apparatus 100 further includes a memory device 114 on the spin orbit electrode 102, the memory device 114 is laterally distant from the memory device 106. A dielectric spacer 118 is adjacent to the memory device 114 and is also on a portion of the spin orbit electrode 102. In the cross-sectional illustration, the dielectric spacer 118 has a spacer portion 118A that is adjacent to sidewall 114A, and a spacer portion 118B that is adjacent to sidewall 114B.

The memory apparatus 100 further includes an electrode 122 on and in contact with the spin orbit electrode 102. As shown the electrode 122 has a portion 122A that is between the memory device 106 and the memory device 114 on spin orbit electrode portion 102A. An electrode portion 122B is on a spin orbit electrode portion 102B, and adjacent to spacer portion 110B as shown. The electrode 122 includes an electrode portion 122C that is on spin orbit electrode portion 102C and adjacent to spacer portion 118B, also as shown.

In the illustrative embodiment, the electrode portion 122A has a sidewall 122D and 122E that are substantially vertical. In such an embodiment, the uppermost surface 122F and lowermost surface 122G each have a substantially same width $W_{M1M2}$. $W_{M1M2}$ is dictated by a lateral spacing between the memory devices 106 and 114 and lateral thickness (along Y-axis) of spacer portions 110A and 118A. $W_{M1M2}$ may range between 40 nm and 100 nm.

The memory apparatus 100A further includes two interconnect structures that are coupled for voltage application. An interconnect structure 126 is in contact with a lowermost surface 102D spin orbit electrode 102 and laterally distant from the memory device 106. A second interconnect structure 130 is also in contact with the lowermost surface 102D but is laterally distant from the memory device 114. As shown, the memory device 106 and the memory device 114 are each located laterally between interconnect structure 130 and the interconnect structure 126. In the illustrative embodiment, conductive interconnect 126 has a sidewall 126A that is distant from the spacer portion 110B by a spacing $T_{CM1}$. Depending on embodiments, $T_{CM1}$ ranges between 10 nm and 100 nm. The spacing $T_{CM1}$ represents a portion of a path 132 that electrical current can take through the electrode portion 122B, when the memory apparatus is operational. In the illustrative embodiment, the conductive interconnect 130 has a sidewall 130A that is distant from the spacer portion 118B by a spacing $T_{CM2}$. Depending on embodiments, $T_{CM2}$ ranges between 10 nm and 100 nm. The spacing $T_{CM2}$ represents a portion of a path 132 that electrical current can take through the electrode portion 122C.

As shown, since the electrode 122 has a lower electrical resistance than the spin orbit electrode 102, the electrical current may have path 132 as shown. Current may flow, for example, from conductive electrode 126 through the spin orbit electrode portion 102B into a less resistive electrode portion 122B and then back into spin orbit electrode portion 102E under the memory device 106 and spacer 110. The current may then proceed back into the electrode portion 122A until reaching the vicinity of spacer portion 118A where it may traverse into the spin orbit electrode portion 102F under the spacer portion 118A, memory device 114 and spacer portion 118B. The current may flow back into the electrode portion 122C after passing under spacer portion 118B, and subsequently into conductive interconnect 130, through spin orbit electrode portion 102C. It is also possible, that some electrical current will also flow laterally through spin orbit electrode portions 102B and 102C. The amount of current flowing through the spin orbit electrode portions 102B and 102C will depend on the relative electrical resistance between spin orbit electrode 102 and electrode 122.

While $T_{CM1}$ and $T_{CM2}$ are finite in the illustrative embodiment, in other embodiments $T_{CM1}$ and $T_{CM2}$ are both substantially zero, for example, conductive interconnect sidewalls 126A and 130A may be directly below spacer portions 110B and 118B, respectively.

The electrode 122 has a vertical thickness $T_E$ as measured from an uppermost surface 102G of the spin orbit electrode 102. $T_E$ may be dependent on the material of the electrode 122 as well as on the parameters $W_{M1M2}$, $T_{CM1}$ and $T_{CM2}$. In embodiments, $T_E$ is between 5 nm and 30 nm. In some exemplary embodiments, $T_E$ is between 5 nm and 20 nm.

As shown, electrode portions 122A, 122B and 122C have a substantially uniform thickness, $T_E$. In other embodiments, electrode portion 122A has a concaved-up profile (dashed line 133), where $T_E$ is maximum directly adjacent to spacer portions 110A and 118A and minimum approximately midway between spacer portions 110A and 118A. In some embodiments, electrode portion 122A has a vertical thickness $T_E$ that varies by less than 2 percent across $W_{M1M2}$.

In an embodiment, the electrode 122 includes tungsten, tantalum, tantalum nitride, titanium nitride and platinum. In an embodiment, the electrode 122 includes a material that has a lower electrical resistance than an electrical resistance of the spin orbit material 102. The thickness of the electrode 122 may be selected based on the choice of materials utilized. A combination of material choice and thickness provides an effective electrical resistance in the various portions of electrode 122. For example, electrode portion 122A includes a material and has a thickness to provide an effective electrical resistance that is less than an electrical resistance of spin orbit electrode portion 102A. Similarly, electrode portion 122B includes a material and has a thickness to provide an effective electrical resistance that is less than an electrical resistance of spin orbit electrode portion 102B. Electrode portion 122C includes a material and has a thickness to provide an effective electrical resistance that is less than an electrical resistance of spin orbit electrode portion 102C. It is to be appreciated that the relative thickness between electrode portions 122A, 122B and 122C do not vary by more than 2% and that all include a same material.

The spin orbit electrode 102 has a thickness, $T_S$ as measured from an uppermost surface 134A of dielectric 134. In an embodiment, spin orbit electrode 102 has a thickness between 2 nm and 10 nm.

In other embodiments, the electrode 122 includes a material that is substantially similar to a material of the spin orbit electrode 102. In some such embodiments, the thickness of the electrode portion above each corresponding spin orbit electrode portion is approximately 2:1. For example, the ratio of $T_E$ to $T_S$ between electrode portion 122B and spin orbit electrode portion 102C, the ratio of $T_E$ to $T_S$ between electrode portion 122A and spin orbit electrode portion 102B and the ratio of $T_E$ to $T_S$ between electrode portion 122C and spin orbit electrode portion 102D are each approximately 2:1.

The spin orbit electrode 102 includes a metal with a high degree of spin orbit coupling. A metal with a high degree of spin-orbit coupling has an ability to inject a large spin polarized current in to the memory device 106 and/or memory device 114. In an embodiment, the spin orbit electrode 102 includes one or more of tantalum, tungsten, platinum or gadolinium, β-Tantalum (β-Ta), Ta, β-Tungsten ((β-W), W, Pt, Copper (Cu) doped with elements such as Iridium, Bismuth and any of the elements of 3d, 4d, 5d and 4f, 5f periodic groups in the Periodic Table which may exhibit high spin orbit coupling. Layers of 2D materials of $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$. In an embodiment, SOT layer including tungsten, tantalum or copper can be doped with Co, Fe, Ni, MnGa, MnGeGa, Bct-Ru, Gd or Tb. A spin orbit electrode 102 including a beta phase tantalum or beta phase tungsten has a high spin hall efficiency. A high spin hall efficiency denotes that the spin orbit electrode 102 can generate a large spin hall current for a given charge current that is passed through the spin orbit electrode 102.

In an embodiment, the conductive interconnects 126 and 130 each include a barrier layer, such as tantalum nitride, and a fill metal, such as copper, tungsten or ruthenium. The conductive interconnect 110 may include a material such as W, Ta, Ir, Bi, TaN or Hf. In other embodiments, the conductive interconnect 110 may include a barrier layer such as Ta, Ru, and a fill layer such as Cu, Ni, Co or Pt.

In an embodiment, memory device 106 and 114 each include a magnetic tunnel junction (MTJ) device which is described further below.

The dielectric spacer 110 and dielectric spacer 118 include a same dielectric material. The dielectric spacer 110 provides electrical insulation between the memory device 106 and electrode portions 122A and 122B. The dielectric spacer 118 provides electrical insulation between the memory device 114 and portions of the electrode 122. In an embodiment, the dielectric spacer 110 and dielectric spacer 118 each include silicon and at least one of oxygen, carbon or nitrogen. The dielectric spacer 110 and dielectric spacer 118 each have a lateral thickness that ranges between 2 nm and 10 nm.

The dielectric 134 may also include silicon and one or more of oxygen, carbon or nitrogen. In an embodiment, the dielectric 134 includes a different material from the material of dielectric spacer 106 and 118.

In the illustrative embodiment, the dielectric 134 is above a substrate 138 which includes a suitable semiconductor material such as but not limited to, single crystal silicon, polycrystalline silicon and silicon on insulator (SOI). In another embodiment, substrate 138 includes other semiconductor materials such as germanium, silicon germanium or a suitable group III-N or a group III-V compound. Logic devices such as MOSFET transistors and access transistors and may be formed on the substrate 138, below the dielectric 134. Logic devices such as access transistors may be integrated with memory devices such as spin orbit memory devices to form embedded memory. Embedded memory including spin orbit memory devices and logic MOSFET transistors may be combined to form functional integrated circuit such as a system on chip.

Figure 1B:
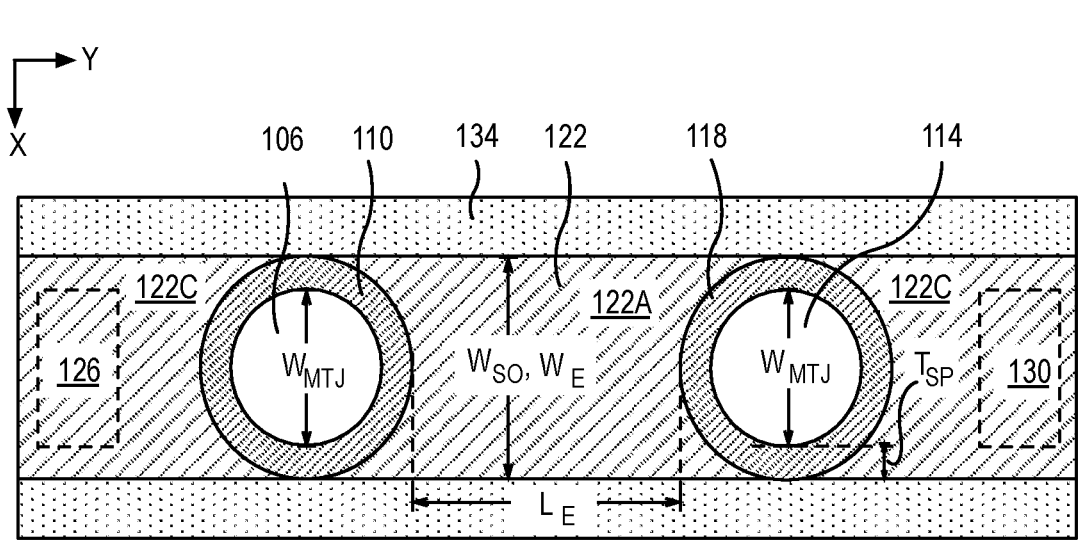
FIG. 1B illustrates a plan view of FIG. 1A, in accordance with an embodiment of the present disclosure.

FIG. 1B illustrates a plan view of FIG. 1A, in accordance with an embodiment of the present disclosure. In the illustrative embodiment, the memory devices 106 and 114 have a circular plan view profile. The dielectric spacer 110 laterally surrounds memory device 106 and dielectric spacer 118 laterally surrounds memory device 114. As shown the spin orbit electrode 102 has a width, $W_{SO}$ (defined along the X-axis in FIG. 1B), the memory devices 110 and 114 each have a width, $W_{MTJ}$ (defined along the X-axis) and the dielectric spacer has an annular thickness, $T_{SP}$. Although, $T_{SP}$ is shown along the X-axis, $T_{SP}$ is substantially the same anywhere in the X-Y plane. In the illustrative embodiment, $W_{SO}$ is substantially equal to the combined sum of $W_{MTJ}$ and two times $T_{SP}$. In an embodiment, $W_{SO}$ is between 20 nm and 95 nm, $W_{MTJ}$ is between 10 nm and 75 nm $T_{SP}$ is between 2 nm and 10 nm.

In some embodiments, memory device 106 has a width $W_{MTJ}$ that is greater than a width $W_{MTJ}$ of the memory device 110. In other embodiments, memory device 106 has a width $W_{MTJ}$ that is less than a width $W_{MTJ}$ of the memory device 110.

As illustrated in FIG. 1B, the electrode portion 122A is separated from electrode portion 122B by the dielectric spacer 110. The electrode portion 122A is separated from electrode portion 122C by the dielectric spacer 118, also as shown. The electrode 122 has a width that is substantially the same as the width $W_{SO}$. The spin orbit electrode 102 is not visible in FIG. 1B.

In other embodiments, the memory device has a width, $W_{MTJ}$ that is substantially equivalent to $W_{SO}$. In an embodiment, for a given $W_{SO}$ when $W_{MTJ}$ is substantially equivalent to $W_{SO}$, current flowing through the spin orbit electrode 102 can generate a larger spin Hall current than when $W_{MTJ}$ is less than $W_{SO}$.

In the illustrative embodiment, the electrode 122 has a width $W_E$ that is substantially the same as $W_{SO}$.

Figure 1C:
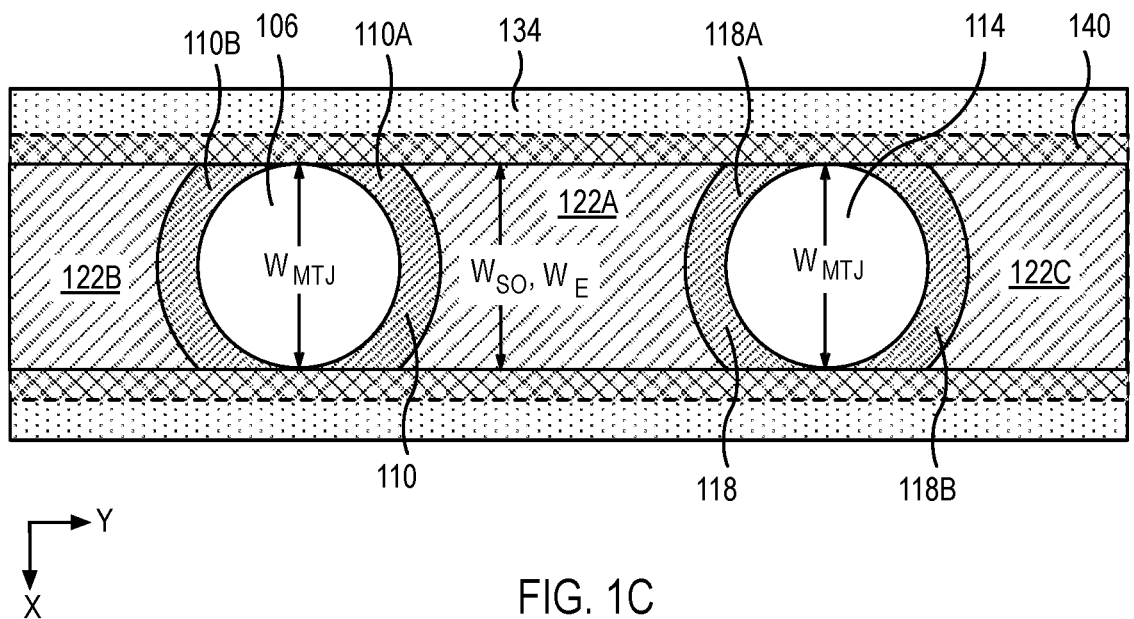
FIG. 1C illustrates a plan view of a first MTJ and a second MTJ, where a width of the spin orbit electrode, and an electrode on the spin orbit electrode is substantially equivalent to a width of the first MTJ and a width of the second MTJ.

FIG. 1C illustrates a plan view of memory devices 106 and 114, where the width, $W_{SO}$ of the spin orbit electrode 102 (directly under the electrode 122 and not visible in the plan view illustration) is substantially equivalent to $W_{MTJ}$ of memory device 106. As shown $W_{SO}$ is also substantially equivalent to width, $W_{MTJ}$ of memory device 114. The memory devices 106 and 114 illustrated in FIG. 1C have a circular plan view profile. In other embodiments, the memory devices 106 and 114 have a rectangular plan view profile. In the illustrative embodiment, the electrode 122 has a width $W_E$ that is substantially the same as the width, $W_{SO}$ of spin orbit electrode 102.

In the illustrative embodiment, dielectric spacer 110 does not laterally surround memory device 106. As shown, dielectric spacer portions 110A and 110B are separated from each other by the memory device 106. Spacer portions 110A and 110B each have a substantially similar plan view profile. The spacer portions 110A and 110B each have a spatial extent along the X-axis, that does not extend over the dielectric 134, as shown.

In the illustrative embodiment, dielectric spacer 118 does not laterally surround memory device 114. As shown, dielectric spacer portions 118A and 118B are separated from each other by the memory device 114. Spacer portions 118A and 118B each have a substantially similar plan view profile. The spacer portions 118A and 118B each have a spatial extent along the X-axis, that does not extend over the dielectric 134, as shown.

In an embodiment, a dielectric spacer 140 is adjacent to the memory device 106, spacer 110, memory device 114 and spacer 118. The dielectric spacer is designed to protect sidewall portions of memory devices 106 and 114 that are not laterally covered (in the X-Y plane in FIG. 1D) by spacer 110 and 118, respectively. As shown dielectric spacer 140 is also directly on a portion of dielectric 134.

Figure 1D:
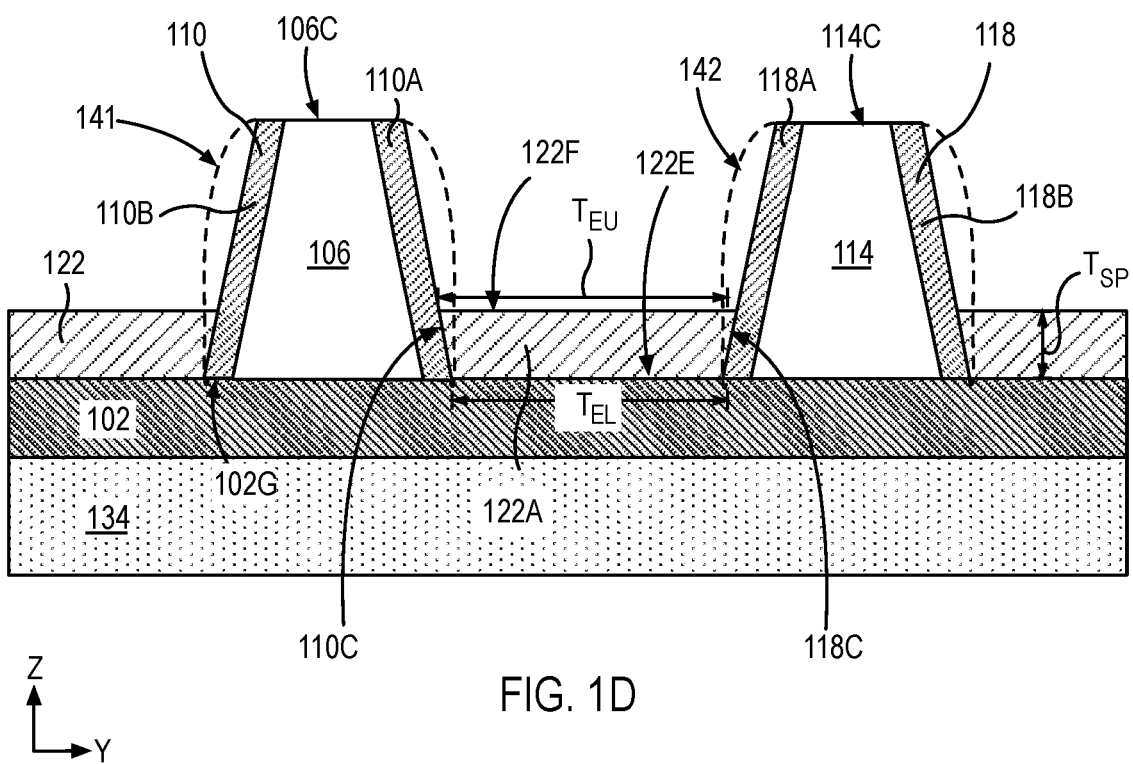
FIG. 1D illustrates a cross-sectional view of a first magnetic tunnel junction (MTJ) and a second MTJ, where the first MTJ and the second MTJ each have tapered profiles and coupled with a same spin orbit electrode, in accordance with an embodiment of the present disclosure.

In some embodiments, memory devices 106 and 114 each have tapered profiles such as is illustrated in FIG. 1D. The profiles may be tapered, such as for example, between 2-5 degrees with respect to a normal from the uppermost surface 106C or 114C. In some such embodiments, electrode portion 122A has an uppermost surface 122F that has a lateral thickness, $T_{EU}$ that is greater than a lateral thickness, $T_{EL}$ of a lowermost surface 122E due to the tapered profiles in the memory devices 106 and 114. The thickness $T_{SP}$ of the electrode 122 may be greater, in examples, where the memory devices 106 and 114 each have tapered profiles, compared to memory devices 106 and 114 where sidewalls are not tapered.

In the illustrative embodiment, the dielectric spacers 110 and 118 are conformal to the memory devices 106 and 114, respectively. In other embodiments, the dielectric spacer portion 110A and 110B each have wider portions approximately adjacent to an uppermost surface 106C of the memory device 106 and narrower portions adjacent to an uppermost surface 102G of the spin orbit electrode 102 (dashed lines 141). In some such embodiments, the dielectric spacer portion 118A and 118B each have wider portions adjacent to an uppermost surface 114C of the memory device 114 and a narrower portion adjacent to an uppermost surface 102G of the spin orbit electrode 102 (dashed lines 142).

While a memory apparatus including two memory devices on a single spin orbit electrode is depicted in FIGS. 1A-1D, a memory apparatus may include between 8-10 memory devices that are uniformly separated from each other on a single spin orbit electrode 102. In some embodiments, a memory array may include a second spin orbit electrode each including 8-10 memory devices on a second spin orbit electrode laterally distant from a first spin orbit electrode. The two spin orbit electrodes may be electrically coupled or operated independently.

Figure 2A:
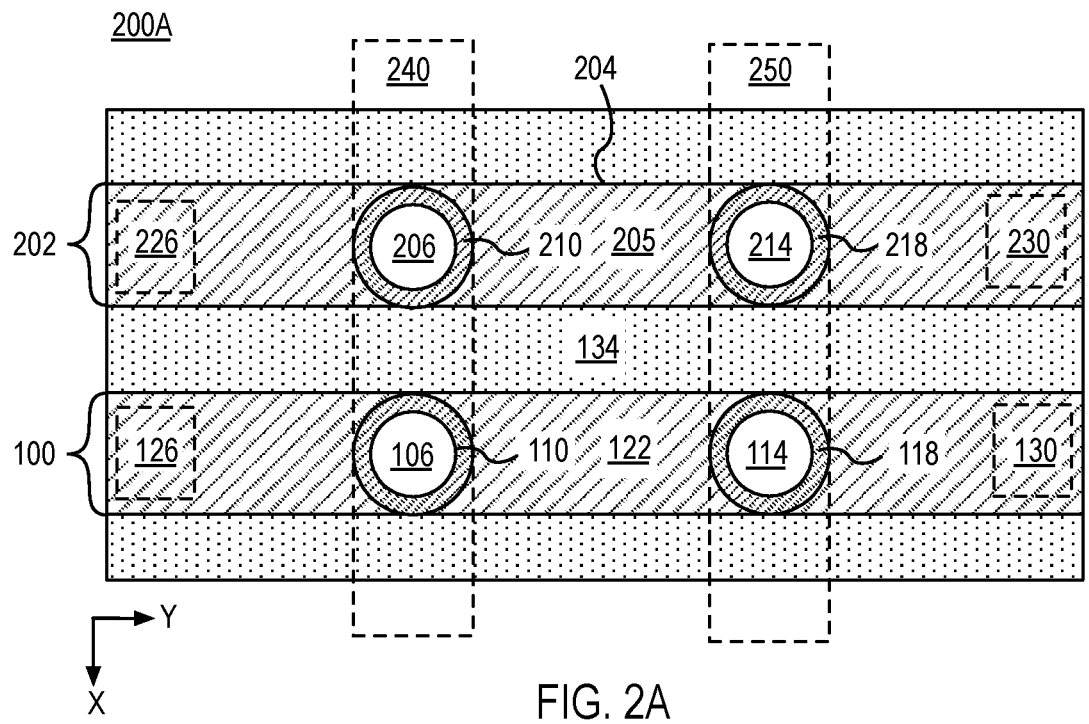
FIG. 2A illustrates a plan view of a memory array, including a first spin orbit electrode coupled with a first MTJ and a second MTJ, and a second spin orbit electrode coupled with a third MTJ and a fourth MTJ, further where the first MTJ is coupled with the third MTJ and the second MTJ is coupled with the fourth MTJ, in accordance with an embodiment of the present disclosure.

FIG. 2A illustrates a plan view of a memory array 200A, including a first apparatus such as memory apparatus 100 and a second memory apparatus such as memory apparatus 202 separated by a dielectric 134. Memory apparatus 202 may have one or more features of the memory apparatus 100. In the illustrative embodiment, the memory apparatus 202 includes a spin orbit electrode 204 and an electrode 205 on the spin orbit electrode 204. The spin orbit electrode 204 is not visible FIG. 2A. The memory apparatus 202 further includes a memory device 206 that is laterally surrounded by a dielectric spacer 210 and a memory device 214 that is laterally surrounded by a dielectric spacer 218.

The memory apparatus 202 further includes a conductive interconnect 226 and a conductive interconnect 230 coupled with the spin orbit electrode 204. The conductive interconnect 230 is laterally separated from the conductive interconnect 226, as shown. In the illustrative embodiment, the conductive interconnects 226 and 230 may be operated independently of the conductive interconnects 126 and 130.

In an embodiment, memory devices 106 and 206 are substantially aligned along the X-axis and memory devices 114 and 214 are also substantially aligned along the X-axis, as shown. In the illustrative embodiment, the memory devices 106 and the memory device 206 are electrically coupled by a shared contact structure 240 as shown. The shared contact structure 240 may couple uppermost surfaces of the memory devices 106 and 206. While the contact structure 240 extends over portions of electrode 122 and electrode 205, contact structure 240 is not in electrical contact with either electrode 122 or electrode 205.

In one example, the memory devices 114 and the memory device 214 are electrically coupled by a shared contact structure 250 as shown. The shared contact structure 250 may couple uppermost surfaces of the memory devices 114 and 214. While the contact structure 250 extends over portions of electrode 122 and electrode 205, contact structure 250 is not in electrical contact with either electrode 122 or electrode 205.

In the illustrative embodiment, the spin orbit electrode 102 is physically separated from spin orbit electrode 204 and not electrically coupled with spin orbit electrode 204.

Figure 2B:
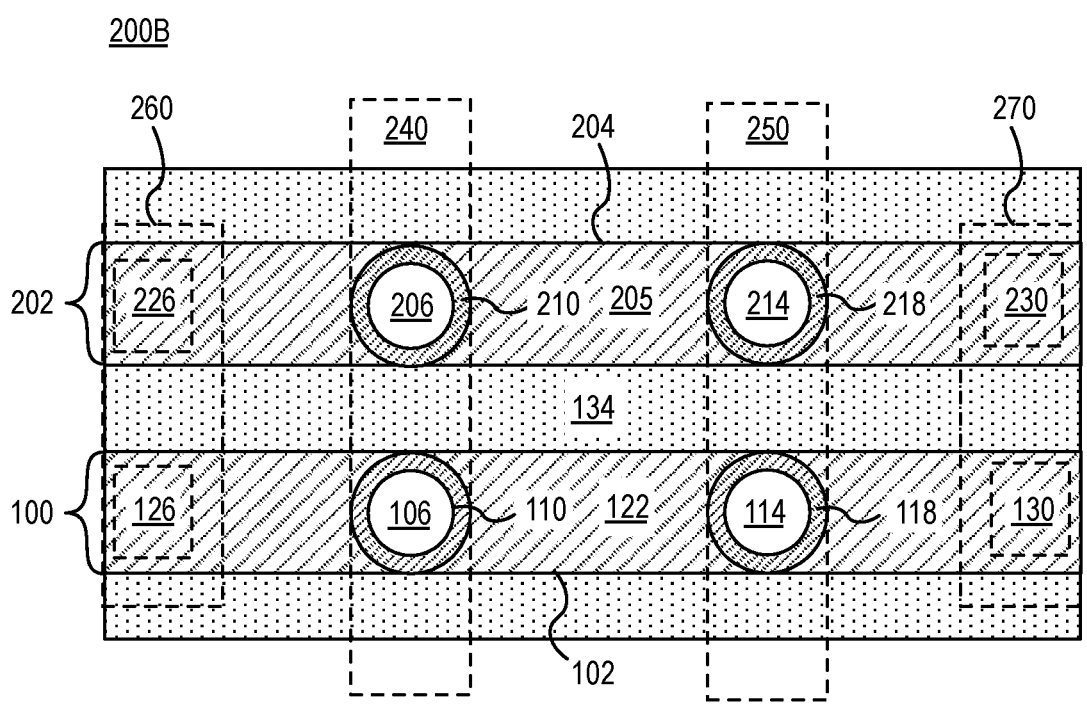
FIG. 2B illustrates a plan view of a memory array, including a first spin orbit electrode coupled with a first MTJ and a second MTJ, and a second spin orbit electrode coupled with a third MTJ and a fourth MTJ, further where the first MTJ is coupled with the third MTJ, the second MTJ is coupled with the fourth MTJ, where a first terminal of the first spin orbit electrode is coupled to a first terminal of the second spin orbit electrode, and further where a second terminal of the first spin orbit electrode is coupled with a second terminal of the second spin orbit electrode, in accordance with an embodiment of the present disclosure.

In other embodiments, the conductive interconnects 126 and 226 may be electrically coupled by a shared contact structure (within dashed line 260) as illustrated in FIG. 2B. The shared contact structure may be located away from the memory array 200B. The dashed lines 260 are illustrated to indicate coupling between the conductive interconnects 126 and 226 and not necessarily the shared contact structure.

In the illustrative embodiment, the conductive interconnects 130 and 230 are electrically coupled by a shared contact structure (dashed lines 270). The dashed lines are illustrated to indicate coupling between the conductive interconnects 130 and 230 and not necessarily a physical structure. A physical contact structure may be located away from the memory array 200B.

In the illustrative embodiment, the spin orbit electrode 102 is physically separated from spin orbit electrode 204 but is electrically coupled with spin orbit electrode 204 through the shared contacts (depicted by dashed lines 260 and 270).

The schemes illustrated in FIGS. 2A and 2B may be operated as an independently selectable memory device or in a biasing scheme where all memory devices are selected together.

Figures 3A, 3B:
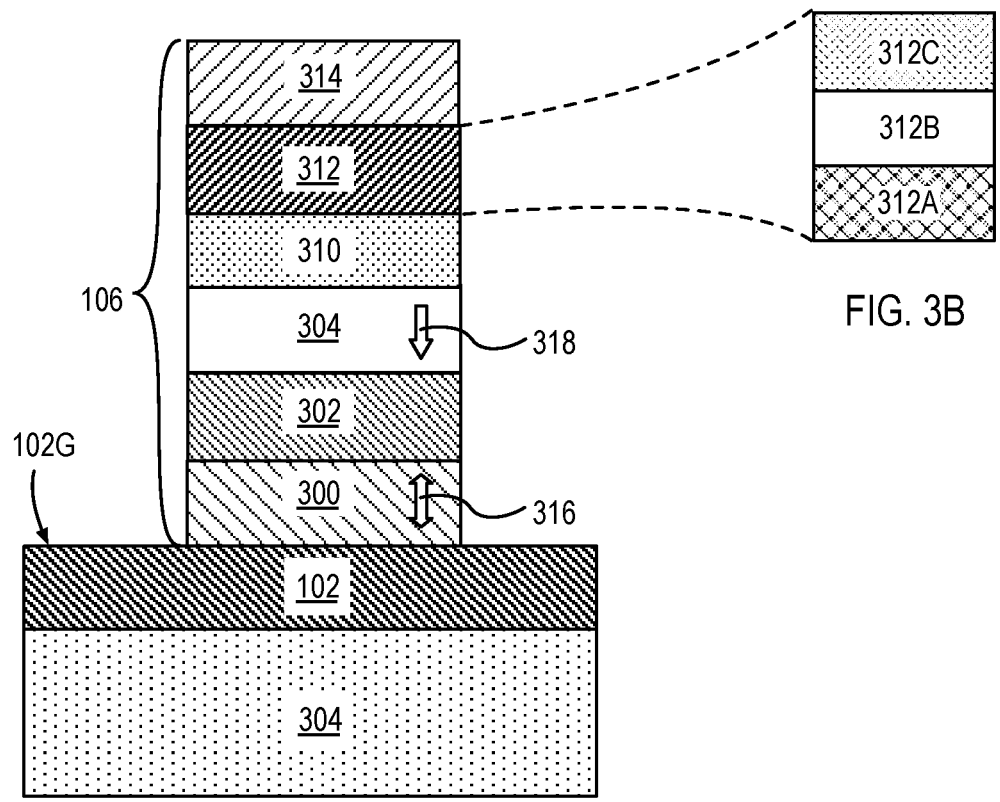
FIG. 3A illustrates a cross-sectional view of an MTJ on a spin orbit electrode, in accordance with an embodiment of the present disclosure.
FIG. 3B illustrates a cross-sectional view of a synthetic anti-ferromagnet structure, in accordance with an embodiment of the present disclosure.

FIG. 3A is an illustration of a cross sectional view of a memory device 106 on the spin orbit electrode 102, in accordance with an embodiment of the present disclosure. The memory device 106 includes a magnet 300, a layer 302 on the magnet 300, and a magnet 304 on the layer 302. The memory device 106 further includes a non-magnetic spacer layer 310 above the fixed magnet 304, a SAF structure 312 on the spacer layer 310 and a top electrode 314 above the SAF structure 312. The non-magnetic spacer layer 310 ferromagnetically couples the first pinning ferromagnet 312A and the fixed magnet 304. In an embodiment, a non-magnetic spacer layer may include a metal such as Ta, or Ir to provide magnetic coupling. The top electrode 314 may include a material such as Ta, TaN or TiN. In an embodiment, the top electrode 314 has a thickness between 5 nm and 50 nm.

The magnet 300 has a magnetization 316 that may change orientation during operation. For example, magnetization 316 may orient in the positive or negative Z-direction as indicated by the bi-directional arrow. Such a magnet 300 is herein referred to as a free magnet 300. The direction of magnetization 316 is perpendicular to a plane of an uppermost surface 102G of the spin orbit electrode 102. The free magnet 300 having a magnetization 318 that is perpendicular to the plane of the uppermost surface 102B may also be known as a perpendicular free magnet 300.

The magnet 304 has a magnetization 318 that remains fixed during operation. For example, magnetization 318 may orient in the positive or in a negative Z-direction. In the illustrative embodiment, the magnetization 318 is parallel to magnetization 316 in the free magnet 300. Such a magnet 304 is herein referred to as a fixed magnet 304. The direction of magnetization 318 is perpendicular to a plane of an uppermost surface 102G of the spin orbit electrode 102. The fixed magnet 304 having a magnetization 318 that is perpendicular to the plane of the uppermost surface 102G may also be known as a perpendicular fixed magnet 304.

In the illustrative embodiment, the free magnet 300 includes a magnetic material such as Co, Ni, Fe or alloys of these materials. In an embodiment, the free magnet 300 includes a magnetic material such as CoB, FeB, CoFe or CoFeB. In some embodiments, the free magnet 300 includes a $Co_{100-x-y}Fe_xB_y$, where X and Y each represent atomic percent, further where X is between 50 and 80 and Y is between 10 and 40, and further where the sum of X and Y is less than 100. In one specific embodiment, X is 60 and Y is 20. In an embodiment, the free magnet 300 is FeB, where the concentration of boron is between 10 and 40 atomic percent of the total composition of the FeB alloy. In an embodiment, free magnet 300 has a thickness in the range of 1 nm to 1.5 nm.

In the illustrative embodiment, the layer 302 is a tunnel barrier 302. In an embodiment, tunnel barrier 302 includes a material suitable for allowing electron current having a majority spin to pass through tunnel barrier 302, while impeding, at least to some extent, electron current having a minority spin from passing through tunnel barrier 302. Thus, tunnel barrier 302 (or spin filter layer) may also be referred to as a tunneling layer for electron current of a particular spin orientation. In an embodiment, tunnel barrier 302 includes a material such as, but not limited to, oxygen and at least one of magnesium (e.g., a magnesium oxide, or MgO), or aluminum (e.g., an aluminum oxide such as $Al_2O_3$). In an embodiment, tunnel barrier 302 including MgO has a crystal orientation that is (001) and is lattice matched to free magnet 300 below tunnel barrier 302 and fixed magnet 304 above tunnel barrier 302. In an embodiment, tunnel barrier 302 is MgO and has a thickness in the range of 1 nm to 3 nm. In an embodiment, a free magnet 300 including a $Co_{100-x-y}Fe_xB_y$, is highly lattice matched to the tunnel barrier 302 including an MgO. Lattice matching between a crystal structure of the free magnet 300 and the tunnel barrier 302 enables a higher tunneling magnetoresistance (TMR) ratio in the memory device 106.

In some embodiments, the fixed magnet 304 includes a material and has a thickness sufficient for maintaining a fixed magnetization. In an embodiment, the fixed magnet 304 of the memory device 106 includes an alloy such as CoFe or CoFeB. The alloys of CoFe, CoFeB, FeB may include doping with one or more of Ta, Hf, W, Mo, Ir, Ru, Si or C, to promote high perpendicular anisotropy. Alternatively, the alloys of CoFe, CoFeB, FeB may include thin layers of W, Ta or Molybdenum to promote high perpendicular anisotropy. In an embodiment, the fixed magnet 304 comprises a $Co_{100-x-y}Fe_xB_y$, where X and Y each represent atomic percent, further where X is between 50-80 and Y is between 10 and 40, and further where the sum of X and Y is less than 100. In one specific embodiment, X is 60 and Y is 20. In an embodiment, the fixed magnet 304 is FeB, where the concentration of boron is between 10 and 40 atomic percent of the total composition of the FeB alloy. In an embodiment the fixed magnet 304 has a thickness that is between 1 nm and 2 nm.

In an embodiment, the free magnet 300 and the fixed magnet 304 can have approximately similar thicknesses and an injected spin polarized current which changes a direction of the magnetization 316 in the free magnet 300 can also affect the magnetization 318 of the fixed magnet 304. In an embodiment, to make the fixed magnet 304 more resistant to accidental flipping the fixed magnet 304 has a higher magnetic anisotropy than the free magnet 300. To reduce the stray field acting on the fixed magnet 304 a synthetic antiferromagnetic (SAF) structure 312 may be utilized.

FIG. 3B illustrates a cross-sectional view of the SAF structure 312, in an accordance of an embodiment of the present disclosure. In an embodiment, the SAF structure 312 includes a non-magnetic layer 312B sandwiched between a first pinning ferromagnet 312A and a second pinning ferromagnet 312C as depicted in FIG. 1D. The first pinning ferromagnet 312A and the second pinning ferromagnet 312C are anti-ferromagnetically coupled to each other. The pinning ferromagnets 312A, 312C may be designed to have high coercive fields and a high degree of perpendicular magnetic anisotropy. In an embodiment, the first pinning ferromagnet 312A includes a layer of a magnetic metal such as Co, Ni, Fe, or alloys of magnetic metals such as Co, Ni, Fe, alloys such as Co—Pd, Cp-Pt, Co—W or Co—Mo. In other embodiments the first pinning ferromagnet 312A includes one or more bilayers having a layer of non-magnetic metal on a layer of magnetic metal. Examples of bilayers include Co/Pd, Co/Pt, Co/Ni, Co/W or Co/Mo. In an embodiment, the number of bilayers in first pinning ferromagnet 312A may range between 2 and 6. In an embodiment, the second pinning ferromagnet 312C includes a layer of a magnetic metal such as Co, Ni, Fe, or alloys of magnetic metals such as Co, Ni, Fe, alloys such as Co—Pd, Cp-Pt, Co—W or Co—Mo. In other embodiments the second pinning ferromagnet 312C includes one or more bilayers having a layer of non-magnetic metal on a layer of magnetic metal. Examples of bilayers include Co/Pd, Co/Pt, Co/Ni, Co/W or Co/Mo. In an embodiment, the number of bilayers in second pinning ferromagnet 312B may range between 6 and 10.

In an embodiment, the non-magnetic layer 312B includes a ruthenium or an iridium layer. In an embodiment, a ruthenium based non-magnetic layer 312B has a thickness between 0.3-1.0 nm to ensure that the coupling between the first pinning ferromagnet 312A and the second pinning ferromagnet 312C is anti-ferromagnetic (AF).

While the various embodiments here are illustrated with reference to a memory device 106 on a spin orbit electrode 102, the embodiments are also applicable to spin valves. In an embodiment, a spin valve device includes a layer 302 that is a metal oxide or a metal between the free magnet 300 and fixed magnet 304, instead of a tunneling dielectric MgO.

In an embodiment, memory device 114 includes all the features of the memory device 106 described in association with FIGS. 3A-3B, such as free magnet 300, tunnel barrier 302, fixed magnet 304, spacer layer 310, SAF structure 312 and top electrode 314 in an arrangement as shown.

Figure 4A:
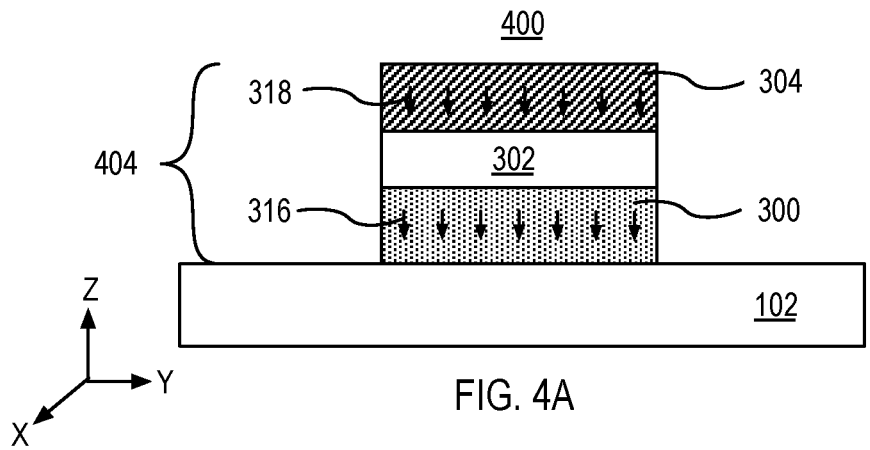
FIG. 4A illustrates a spin orbit memory device in a low resistance state.
Figure 4B:
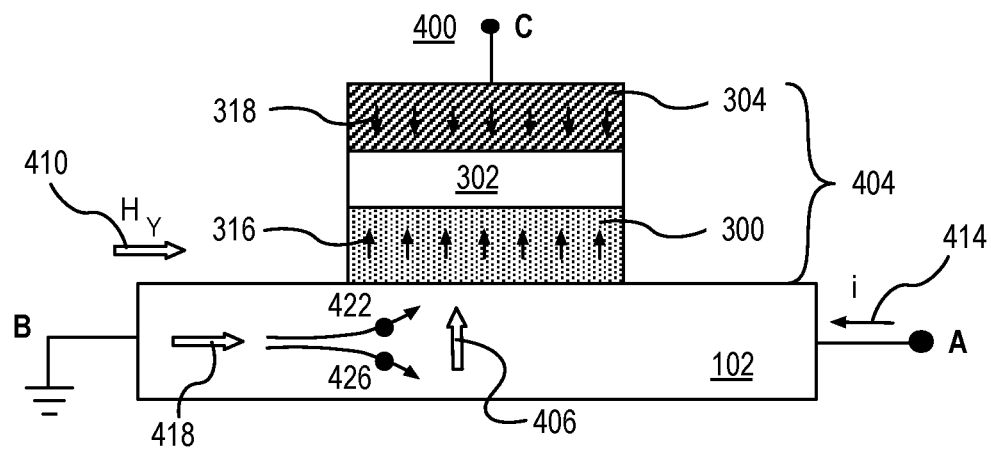
FIG. 4B illustrates a spin orbit memory device switched to a high resistance state after the application of a spin Hall current.
Figure 4C:
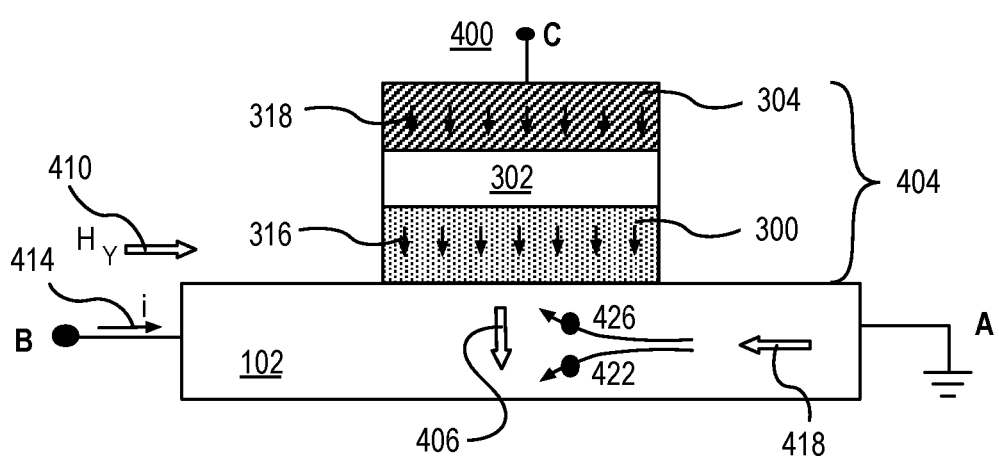
FIG. 4C illustrates a spin orbit memory device switched to a low resistance state after the application of a spin Hall current.

FIGS. 4A-4C illustrate a mechanism for switching a spin orbit memory device such as a spin orbit memory device including a memory device on a spin orbit electrode.

FIG. 4A illustrates a spin orbit memory device 400 including the memory device 404 on the spin orbit electrode 102. In the illustrative embodiment, the memory device 404 includes one or more features of the memory device 106 illustrated in FIG. 3A, such as the free magnet 300, the fixed magnet 304 and the tunnel barrier 302 between the free magnet 300, and the fixed magnet 304. In the illustrative embodiment, magnetization 316 of the free magnet 300 is aligned in a direction that is parallel to the magnetization 318 of the fixed magnet 304. In an embodiment, magnetization 316 and magnetization 318 are both directed in the negative Z-direction as illustrated in FIG. 3A. When the magnetization 316 of the free magnet 300 is in a same direction as a magnetization 418 of the fixed magnet 304, memory device 304 is in a low resistance state.

FIG. 4B illustrates the memory device 304 of the spin orbit memory device 400 switched to a high resistance state. In an embodiment, a reversal in the direction of magnetization 316 of the free magnet 300 in FIG. 4B relative to the direction of magnetization 316 of the free magnet 300 in FIG. 4A is brought about by (a) inducing a spin diffusion current 406 in the electrode 102 in the Y-direction, (by applying a positive voltage bias on terminal A with respect to a grounded terminal B, for example), and (b) by a magnetic field 410, $H_y$, from an external source, along the Y axis (positive or negative Y direction).

In an embodiment, a charge current 414 is passed through the electrode 102 in the negative Y-direction. An electron current 418 flows in the positive Y-direction. The electron current 418 includes electrons with two opposing spin orientations, a type I electron 422, having a spin oriented in the negative x-direction and a type II electron 426 having a spin oriented in the positive X-direction. In an embodiment, electrons in the electron current 418 experience a spin dependent scattering phenomenon in the electrode 102. The spin dependent scattering phenomenon is brought about by a spin-orbit interaction between the nucleus of the atoms in the electrode 102 and the electrons in the electron current 418. The spin dependent scattering phenomenon causes type I electrons 422, whose spins are oriented in the negative x-direction (into the page of FIG. 4B), to be deflected upward towards an uppermost portion of the electrode 102 and type II electrons 426 whose spins are oriented in the positive X-direction to be deflected downward towards a lowermost portion of the electrode 102. The separation between the type I electrons 422 and the type II electrons 426 induces a polarized spin diffusion current 406 in the electrode 102. In an embodiment, the polarized spin diffusion current 406 is directed upwards toward the free magnet 300 of the memory device 404, as is depicted in FIG. 4B. The polarized spin diffusion current 406 exerts a spin Hall torque on the magnetization 316 of the free magnet 300. In an embodiment, a torque is also exerted on the magnetization 316 of the free magnet 300 by an intrinsic or an extrinsic magnetic field, $H_y$, along the Y axis, as illustrated in FIG. 4B. In the illustrative embodiment, the intrinsic or an extrinsic magnetic field, $H_y$ 410 provides a torque component (in the positive Z direction) to break symmetry and switch the magnetization 316 of the free magnet 300.

In a different embodiment, the torque due to the external magnetic field, $H_y$ 410, can be supplemented by a torque from a spin torque transfer mechanism generated by passing a spin polarized current through the memory device 304 by voltage biasing terminal C. Terminal C may be biased relative to terminal B. In one example terminal B may be at some non-zero potential that is lower than a potential of A and C.

FIG. 4C illustrates the memory device 404 of the memory device 400 switched to a low resistance state. In an embodiment, a reversal in the direction of magnetization 316 in the free magnet 300 in FIG. 4C compared to the direction of magnetization 316 in the free magnet 300 in FIG. 4B is brought about by (a) reversal in the direction of the spin diffusion current 406 in the electrode 102 (by applying a positive voltage bias on terminal B with respect to a grounded terminal A), and (b) by an extrinsic magnetic field $H_y$ 410 from magnetization in the spin orbit electrode 102 along the Y axis.

A read operation may be performed by voltage biasing a third terminal C (connected to the fixed magnet 304) with respect to the either terminal and A and B to determine a state of the memory device 404. The terminals A or B may be grounded during the read operation (not illustrated).

Figure 5:
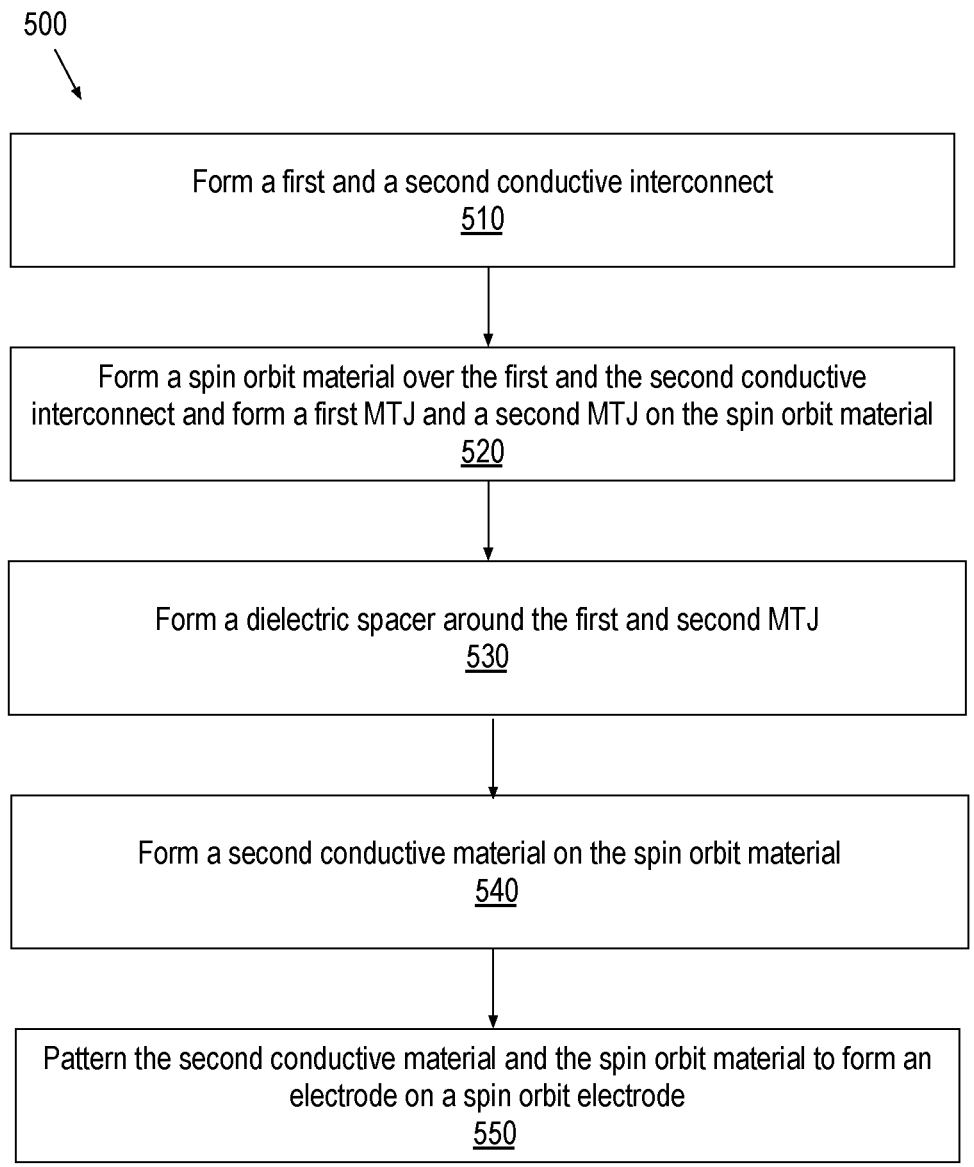
FIG. 5 illustrates a flow diagram for a method to fabricate a memory array, in accordance with embodiments of the present disclosure.

FIG. 5 illustrates a flow diagram of a method to fabricate a spin orbit memory device such as a spin orbit memory device 100. The method 500 begins at operation 510 by forming a first conductive interconnect and a second conductive interconnect in a dielectric above substrate 138. The method 500 continues at operation 520 with the formation of a spin orbit material on the first conductive interconnect, on the second conductive interconnect and the formation of a first memory device and a second memory device on the spin orbit material. The method 500 continues at operation 530 with the deposition of a dielectric spacer layer adjacent to the first and the second memory devices and on portions of the spin orbit material. The method 500 continues at operation 540 with the formation of an electrode material on exposed portions of the spin orbit material not covered by the first and second memory devices. The method 500 concludes at operation 550 by patterning the electrode material and the spin orbit material to form an electrode and a spin orbit electrode.

FIGS. 6A-FIG. 8B illustrate cross-sectional views of the memory apparatus 100 illustrated in FIG. 1A evolving as a fabrication method, such as method 500, is practiced.

FIG. 6A illustrates the structures of conductive interconnects 126 and 130 surrounded by a dielectric 134 formed above a substrate 138. In an embodiment, the conductive interconnects 126 and 130 are formed in a dielectric 134 by a damascene or a dual damascene process. In an embodiment, the conductive interconnect 126 includes a barrier layer, such as titanium nitride, ruthenium, tantalum, tantalum nitride, and a fill metal, such as copper, tungsten. In an embodiment, the conductive interconnects 126 and 130 are fabricated using a subtractive etch process when materials other than copper are utilized. In one such embodiment, the conductive interconnects 126 and 130 include a material such as but not limited to titanium nitride, ruthenium, tantalum, tantalum nitride. In some examples, the dielectric 134 includes a material such as but not limited to silicon dioxide, silicon nitride, silicon carbide, or carbon doped silicon oxide. In an embodiment, the dielectric 134 has an uppermost surface 134A that is substantially co-planar with each of the uppermost surfaces 126A and 130A of the conductive interconnects 126 and 130, respectively. Depending on embodiments, the dielectric 134 has a total thickness between 70 nm-120 nm. In some examples, at least one of the conductive interconnects 126 or 130 is electrically connected to a circuit element such as an access transistor (not shown). Logic devices such as access transistors may be integrated with memory devices such as a spin orbit device to form embedded memory.

FIG. 6B illustrates a cross-sectional view of the structure in following the deposition of a layer 600 including a spin orbit material (herein spin orbit layer 602) on uppermost surfaces 126A, 130A and 134A. As shown, memory device 106 and 114 are also formed on a portion of the spin orbit electrode 102.

In an embodiment, the spin orbit layer 600 is blanket deposited using a physical vapor deposition (PVD) or a chemical vapor deposition (CVD) process. In an embodiment, layer 600 includes a spin orbit material such as tantalum, tungsten or alloys thereof, where the spin orbit material has a beta-phase cubic structure (herein after, spin orbit layer 600). In some embodiments, the spin orbit layer 600 is deposited to a thickness that is between 2 nm and 20 nm.

In an embodiment, forming the memory device 106 and 114 includes sequentially depositing various layers described in association with FIG. 3A to form a material layer stack for an MTJ. Referring again to FIG. 6B, the individual layers in MTJ material layer stack may be blanket deposited using a variety of deposition processes in a cluster tool. Some layers may be deposited using a physical vapor deposition (PVD) process, for example. Other layers, for example, may be deposited by processes that may include a co-sputter or a reactive sputtering process. In an embodiment, a mask is formed on the MTJ material layer stack and the MTJ material layer stack is patterned to form memory device 106 and memory device 114.

In an embodiment, after all the layers in the MTJ material layer stack are deposited, an anneal is performed. In an embodiment, the anneal is performed immediately post deposition but before patterning of the MTJ material layer stack. A post-deposition anneal of the MTJ material layer stack is carried out in a furnace in a forming gas environment. In an embodiment, the anneal temperature ranges between 300 and 450 degrees Celsius.

As shown, memory device 106 is formed so that sidewall 106B of the memory device 106 is separated from the sidewall 126A of the conductive interconnect 126 by a distance, $D_{CM1}$. In an embodiment, $D_{CM1}$ is at least 5 nm. In the illustrative embodiment, memory device 114 is formed so that sidewall 114B of the memory device 114 is separated from the sidewall 130A of the conductive interconnect 130 by a distance, $D_{CM2}$. In an embodiment, $D_{CM2}$ is at least 5 nm.

Figure 6C:
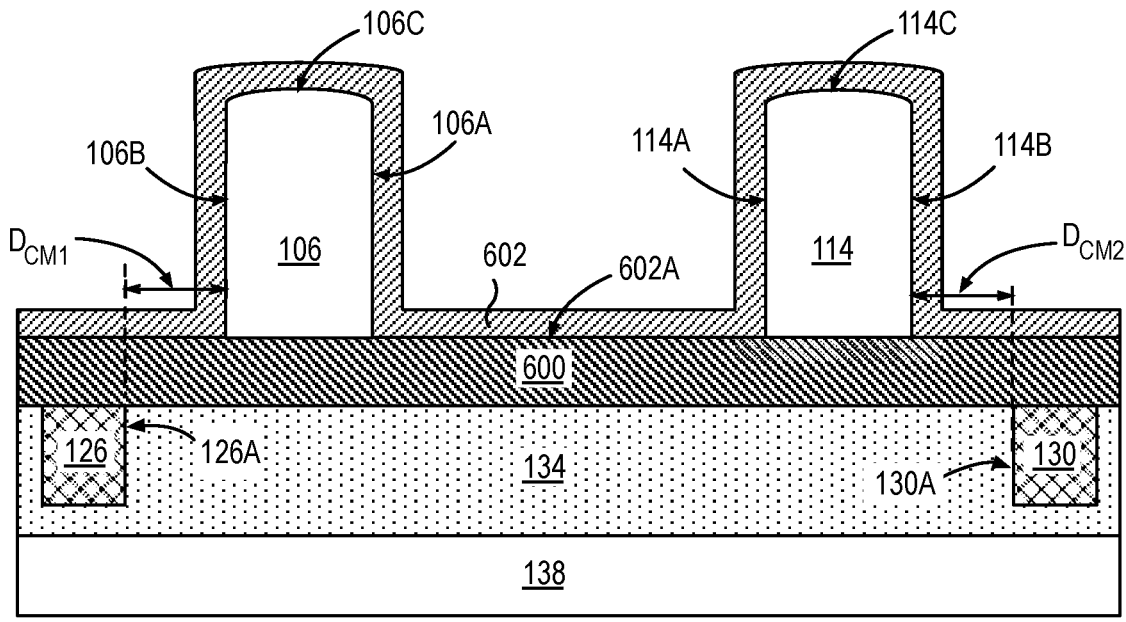
FIG. 6C illustrates a cross-sectional view of the structure in FIG. 6B following the formation of a second dielectric material adjacent to the spin orbit electrode, adjacent to the first MTJ and adjacent to the second MTJ.

FIG. 6C illustrates a cross-sectional view of the structure in FIG. 6B following the formation of a dielectric spacer layer 602 on the memory device 106, on the memory device 114 and on the spin orbit material 600. In the illustrative embodiment, the dielectric spacer layer 602 is blanket deposited on uppermost surface 106C and on sidewalls 106A and 106B of memory device 106, on uppermost surface 114C and on sidewalls 114A and 114B of memory device 114 and on uppermost surface 602A of spin orbit material 600. The deposition process utilized may include a PECVD (plasma enhanced chemical vapor deposition), PVD, CVD or an ALD (atomic layer deposition) process. In an embodiment, the dielectric material includes silicon and nitrogen and/or carbon. In an embodiment, the dielectric spacer layer 602 is deposited to a thickness between 2 nm and 10 nm. The dielectric spacer layer 602 may have a thickness that is dependent on the distance $D_{CM1}$, between sidewalls 126A and 106B and on the distance $D_{CM2}$, between sidewalls 130A and 114B.

Figure 6D:
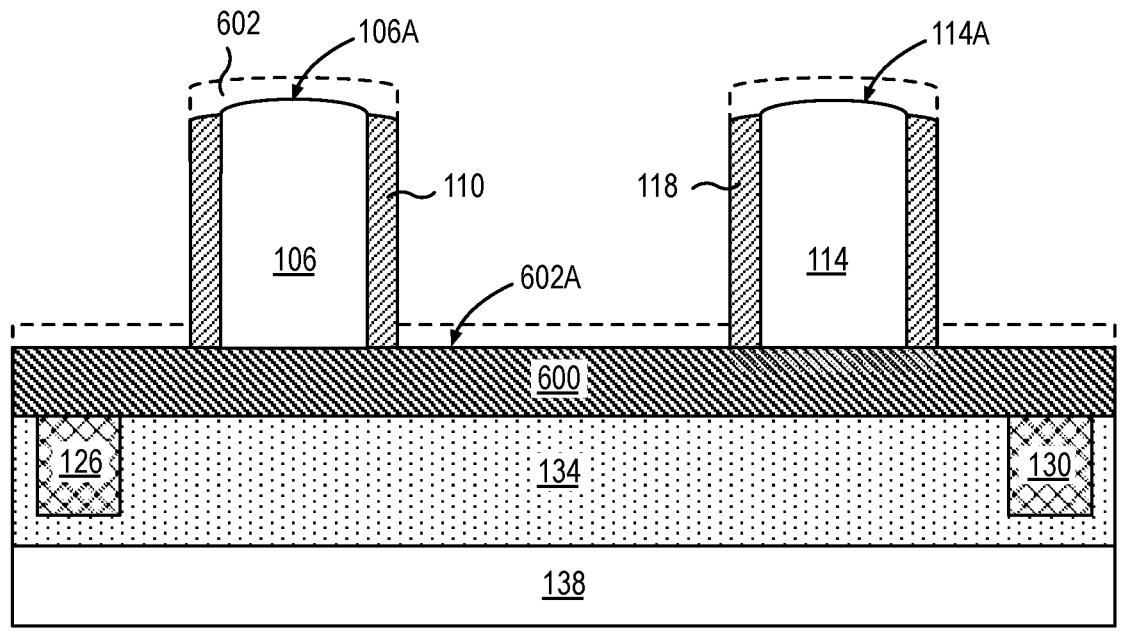
FIG. 6D illustrates a cross-sectional view of the structure in FIG. 6C following the formation of a first dielectric spacer adjacent to the first MTJ and a second dielectric spacer adjacent to the second MTJ.

FIG. 6D illustrates a cross-sectional view of the structure in FIG. 6C following the formation of dielectric spacer 110 adjacent to the memory device 106 and dielectric spacer 118 adjacent to the memory device 114. In one embodiment, the dielectric spacer layer 602 (dashed lines) is etched by a plasma etch process. The plasma etch removes the dielectric spacer layer 602 from above the uppermost surfaces 106C, 114C and 602A. The dielectric spacer 110 and dielectric spacer 118 may be recessed below the uppermost surfaces 106C and 114C of the memory device 106 and 114, respectively as shown.

Figure 6E:
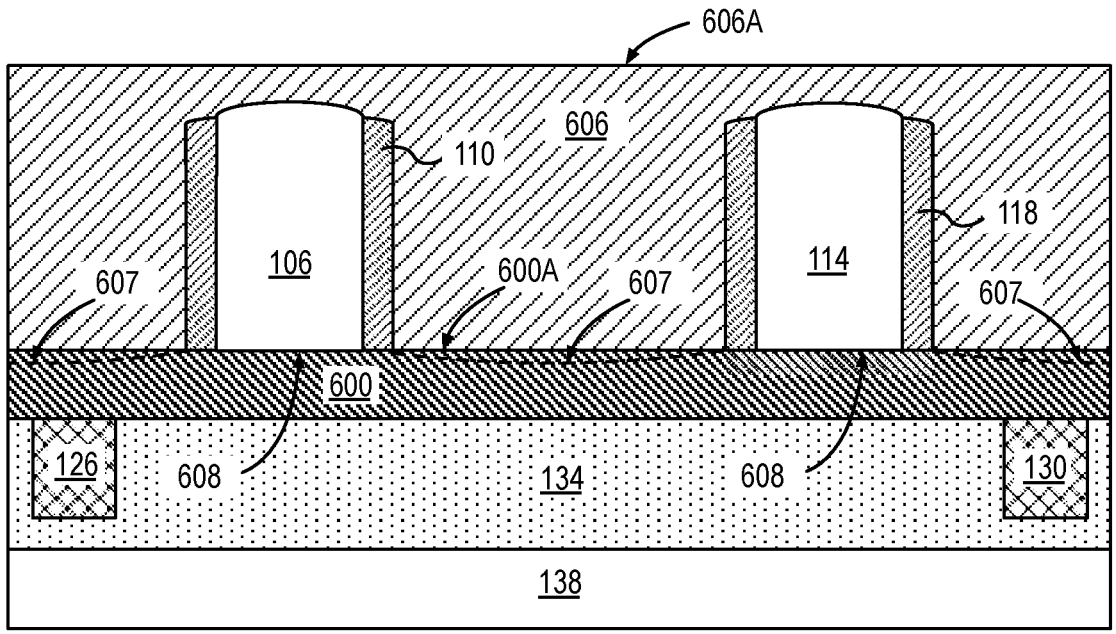
FIG. 6E illustrates a cross-sectional view of the structure in FIG. 6D following the deposition of a conductive material on the first MTJ, on the second MTJ, adjacent to the first and second dielectric spacers, on the spin orbit material and following planarization of the conductive material.

FIG. 6E illustrates a cross-sectional view of the structure in FIG. 6D following the deposition of a conductive material 606 on the memory device 106, on the memory device 114, adjacent to dielectric spacer 110 and dielectric spacer 118, on the spin orbit material 600 and following planarization of the conductive material 606. In some embodiments, a sputter clean of the spin orbit material surface 600A may be performed prior to deposition of the conductive material 606. For example, an in-situ argon sputter clean may be performed to remove any resistive debris formed on the spin orbit material surface 600A during one or more upstream process operations. In some embodiments, the sputter clean may recess the spin orbit material surface 600A as indicated by dashed lines 607. The recess may range less than 0.5 nm relative to the interface 608 between the memory device 106 or 114 and spin orbit material 600, as shown.

In an embodiment, the conductive material 606 includes a material that the same or substantially the same as the material of the electrode 122. The conductive material 606 may be deposited by a PECVD, PVD, CVD or an ALD process. To uniformly recess the conductive material 606 in a downstream operation, a planarization process is performed. In an embodiment, the planarization includes a chemical mechanical polish (CMP) process. In the illustrative embodiment, CMP process is utilized to planarize the conductive material 606 and form an uppermost surface 606A that is substantially planar as shown. In some embodiments, the CMP process may planarize portions of the memory devices 106 and 114 and the spacers 110 and 118 (not shown).

Figure 6F:
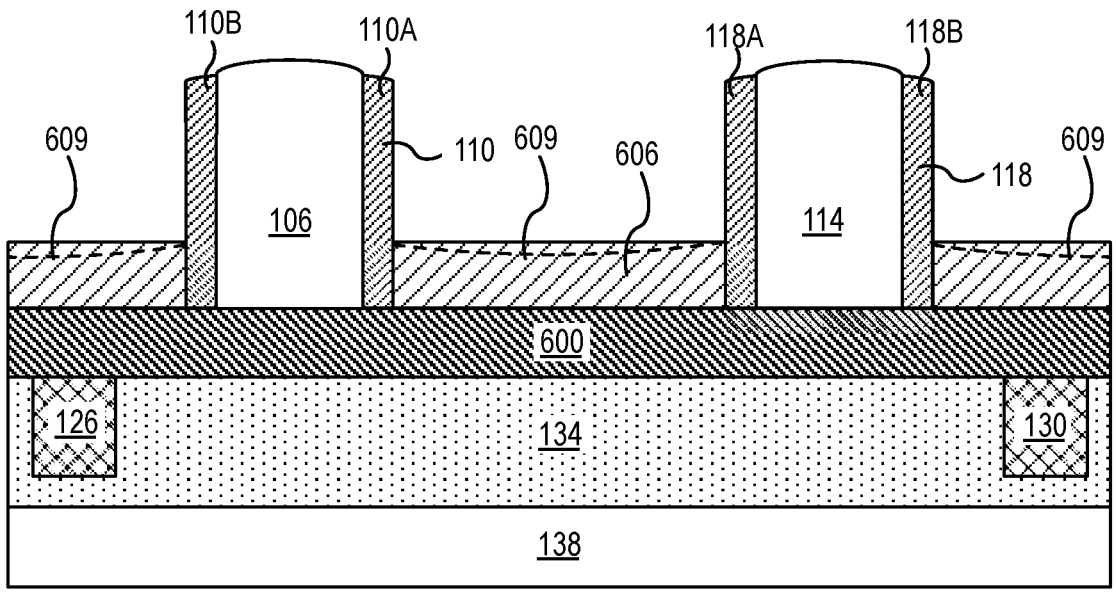
FIG. 6F illustrates a cross-sectional view of the structure in FIG. 6E following the process to recess the conductive material below a top surface of the first MTJ and below a top surface of the second MTJ.

FIG. 6F illustrates a cross-sectional view of the structure in FIG. 6E following the process to recess the conductive material 606 below the uppermost surfaces 106C, 114C of the memory device 106 and memory device 114, respectively. In an embodiment, a wet chemical etch is performed to recess the conductive material 606. In some embodiments, the wet chemical etch process recesses the conductive material 606 and forms an uppermost surface 606A that is substantially planar as illustrated. In other embodiments, depending on the grain boundary and the wet chemical process utilized, the uppermost surface 606A may be concaved or recessed as indicated by the dashed lines 609. The recess may range between 0.5 nm and 1 nm relative to an uppermost point of the conductive material 606 adjacent to spacer portions 110A, 110B, 118A and 118B.

Figure 7A:
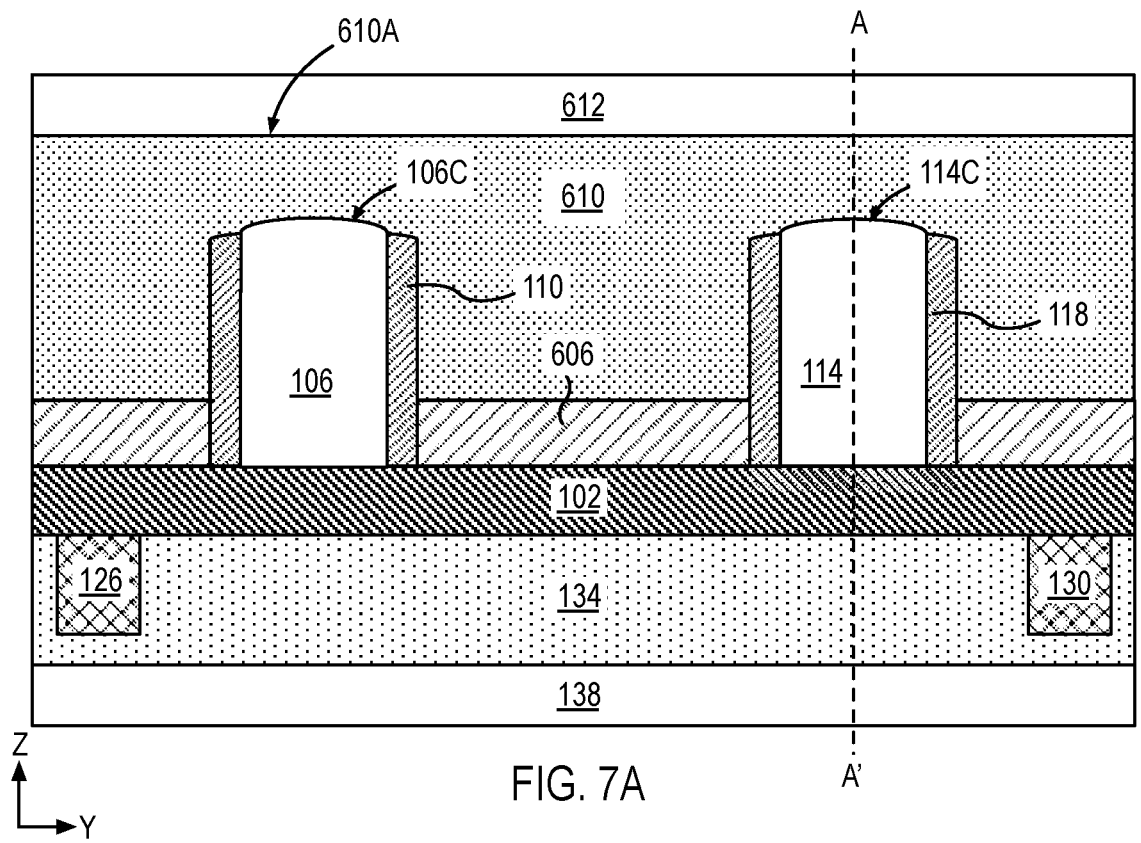
FIG. 7A illustrates a cross-sectional view of the structure of FIG. 6F following the formation of a third dielectric material adjacent to the first MTJ, adjacent to the second MTJ and on the conductive material, followed by the formation of a mask on the third dielectric material.

FIG. 7A illustrates a cross-sectional view of the structure of FIG. 6F following the formation of a dielectric 610 on memory device surface 106C, on the memory device surface 114C, on and adjacent to dielectric spacer 110 and dielectric spacer 118, and on the conductive material 606. In an embodiment, the dielectric 610 includes silicon and at least one of oxygen, carbon and nitrogen. In some embodiments, the dielectric 610 includes silicon and oxygen. In an embodiment, the dielectric 610 is blanket deposited and planarized. In an embodiment, a CMP process is utilized to planarize the dielectric 610 which forms an uppermost surface 610A that is substantially planar, as shown.

A mask 612 is formed on the uppermost surface 610A. In some embodiments, the mask 612 is formed by a lithographic process. In other embodiments, the mask 612 includes a dielectric material that has been patterned. The mask 612 defines a boundary of a spin orbit electrode that will subsequently be formed.

Figure 7B:
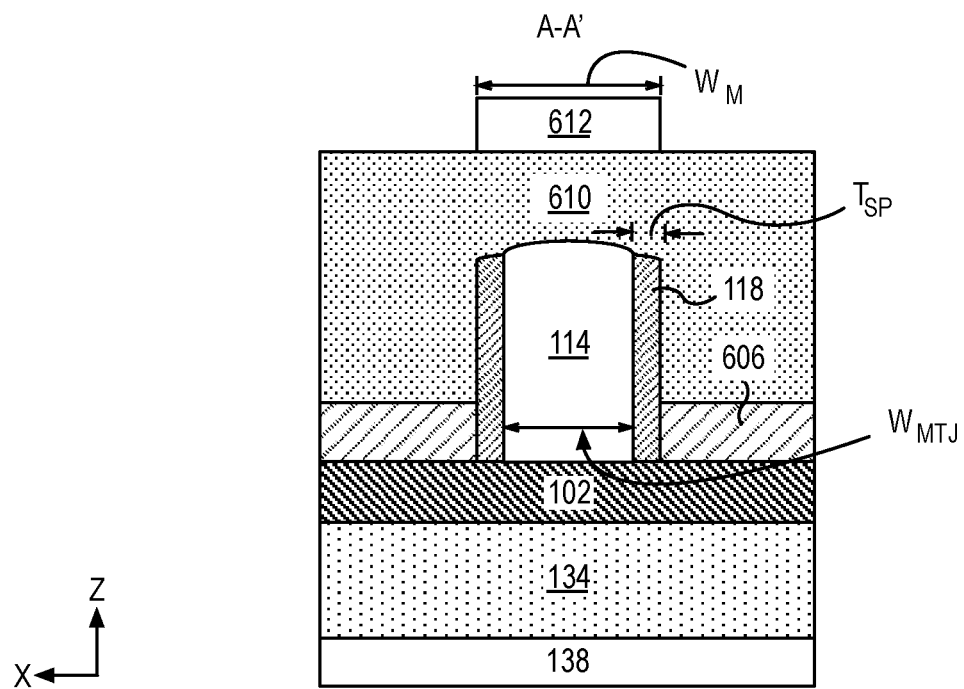
FIG. 7B illustrates a cross-sectional view orthogonal to the cross-sectional view illustrated in FIG. 7A, depicting an extent of the mask.

FIG. 7B illustrates a cross-sectional view orthogonal to the cross-sectional view illustrated in FIG. 7A. A width of the mask relative to the memory device 114 and spacer 118. depicting an extent of the mask. In the illustrative embodiment, the mask has a width $W_M$, that substantially covers the memory device 114 and spacer 118. As shown, $W_M$ is substantially equivalent to a combined width, $W_M$ and two times $T_{SP}$.

Figure 8A:
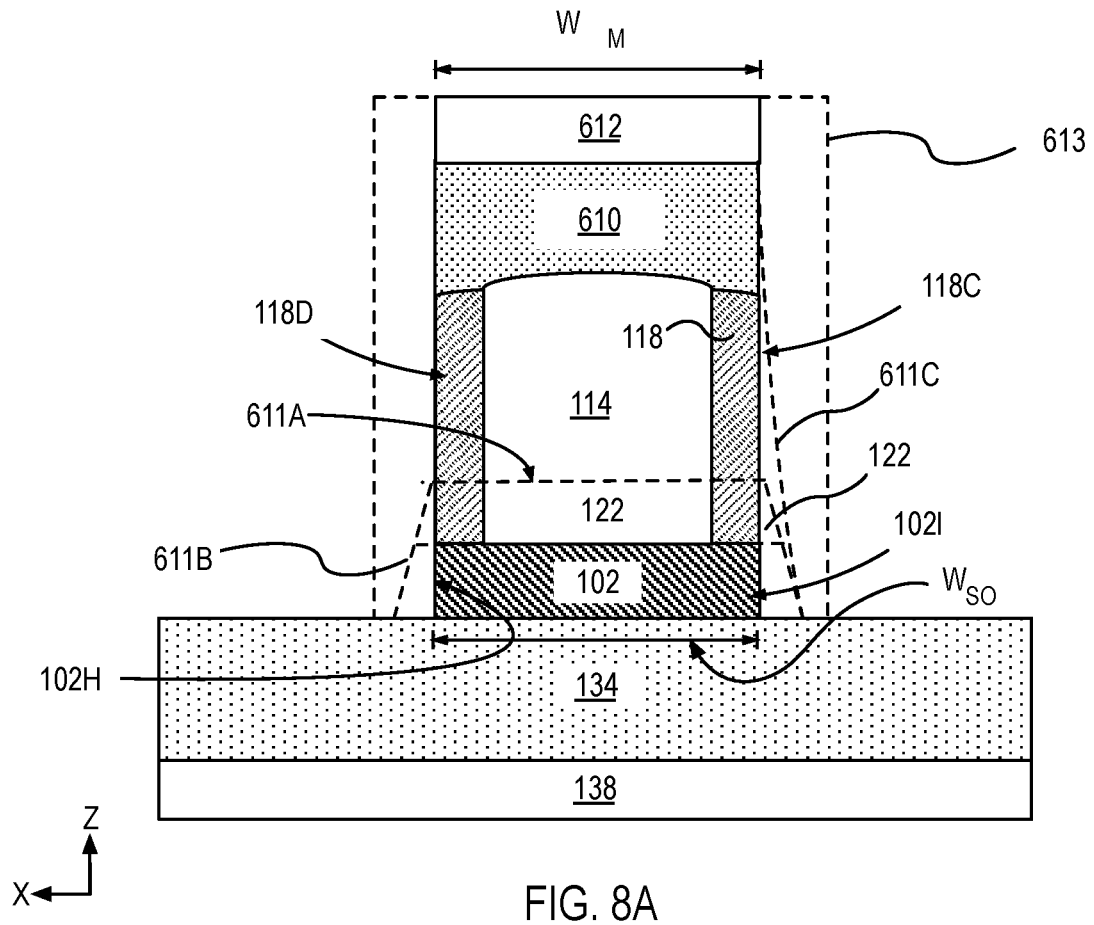
FIG. 8A illustrates a cross-sectional view of the structure of FIG. 7B following the process to etch the third dielectric material, the conductive material and the electrode layer including the spin orbit material.

FIG. 8A illustrates a cross-sectional view of the structure of FIG. 7B following the process to etch the dielectric 610, and the spin orbit material 602. In an embodiment, a plasma etch process is utilized to etch the dielectric 610 and the conductive material 606 (not in view in the cross-sectional plane of FIG. 8A). The conductive material 606 is etched to form electrode 122 (indicated inside dashed line 611A).

In the illustrative embodiment, the spacer provides protection to the memory device 114 during the plasma etch process. The etch process is continued until the spin orbit material is etched to form spin orbit electrode 102 as shown. The boundary of the spin orbit electrode 102 is defined by the mask 612, and the dielectric spacer 118. In the illustrative embodiment, the spin orbit electrode 102 is formed to have a width, $W_{SO}$, that is substantially equal to $W_M$. The spin orbit electrode 102 has sidewalls 102H and 102I that are substantially aligned with sidewalls 118D and 118C respectively.

In some embodiments, some embodiments, the mask does not extend completely over the dielectric spacer 118. A high etch selectivity may be desired between the dielectric spacer 118 and the dielectric 610 to prevent etching of the dielectric spacer 118 while etching the dielectric 610. When the dielectric 610 includes silicon and oxygen and the dielectric spacer 114 includes silicon and nitrogen, the dielectric 610 may be etched selectively to the dielectric spacer 114.

In other embodiments, where $W_M$ extends beyond the dielectric spacer sidewalls 118C and 118D, portions of the dielectric 610 extend beyond spacer sidewalls 118C and 118D (indicated by dashed line 613) after the etch process is complete.

In some embodiments, the electrode 122 and the spin orbit electrode 102 may be tapered as indicated by dashed lines 611B. In other embodiments, the spin orbit electrode 102 may be tapered but the electrode 122 is substantially vertical. In some embodiments, the dielectric 610, electrode 122 and the spin orbit electrode 102 are tapered as indicated by dashed line 611C. In some such embodiments, portions of dielectric 610 remains adjacent to spacer 118 after the etch process.

While a cross section through memory device 114 is depicted in FIG. 8A, a cross-section through memory device 106 illustrates a substantially same result.

Figure 8B:
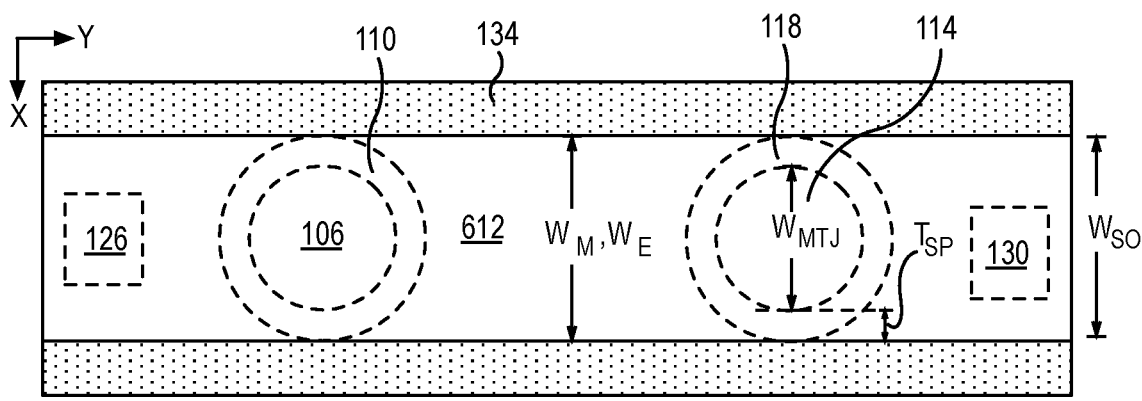
FIG. 8B illustrates a plan view of the structure of FIG. 8A, depicting an embodiment where a width of the spin orbit electrode is substantially equivalent to a width of the first MTJ and a width of the second MTJ.

FIG. 8B illustrates a plan view of the structure of FIG. 8A. Outlines of the memory devices 106 and 114 are shown to provide an illustration of the relative size of $W_M$ and $W_{SO}$ relative to $W_{MTJ}$ and $T_{SP}$. In the illustrative embodiment, $W_{SO}$ is substantially equal to $W_{MTJ}$ plus two times $T_{SP}$ and $W_{SO}$ is also substantially equal to $W_M$, as shown. In other embodiments, where the etch process creates a taper in dielectric 610, $W_{SO}$ is greater than $W_M$. Depending on the etch profile $W_{SO}$ may be greater than $W_E$ of the electrode 102 (covered by mask 612).

Figure 9A:
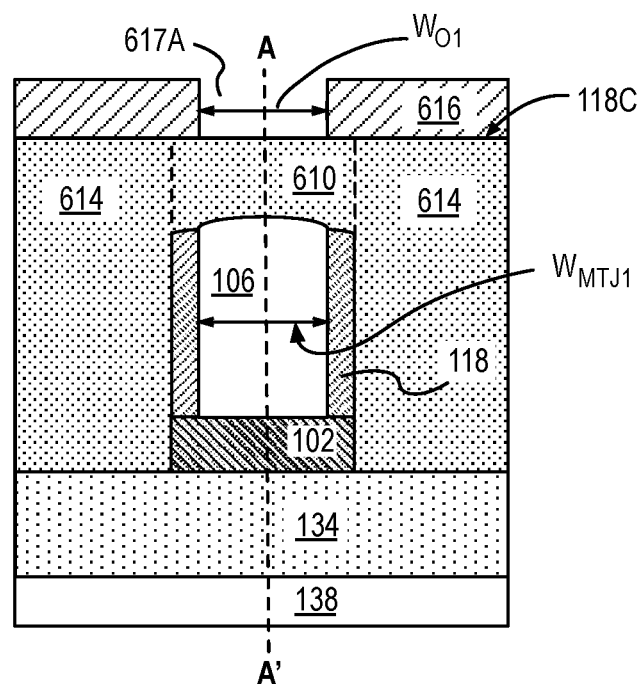
FIG. 9A illustrates a cross-sectional view of the structure in FIG. 8A, following the formation of a fourth dielectric material adjacent to the third dielectric material, following planarization of the fourth dielectric material and following the formation of a mask on the fourth dielectric material, in accordance with an embodiment of the present disclosure.

FIG. 9A illustrates a cross-sectional view of the structure in FIG. 8A, following the formation of a dielectric 614 adjacent to the dielectric 610, adjacent to the dielectric spacer 118 adjacent to spin orbit electrode 102 (and adjacent to electrode 122) and on the dielectric 134. In an embodiment, the dielectric 614 includes a material that is the same or substantially the same as the material of the dielectric 610. The dielectric 614 may be blanket deposited by a PECVD or a CVD process and planarized. In an embodiment, a CMP process is utilized to planarize the dielectric 614 which forms an uppermost surface 614A that is substantially planar, as shown.

A mask 616 is formed on the uppermost surface 614A. In some embodiments, the mask 614 is formed by a lithographic process. In other embodiments, the mask 614 includes a dielectric material that has been patterned. The mask 614 defines an opening 617A to form a metallization structure above the memory device 114.

In the illustrative embodiment, the opening 617A has a width, $W_{O1}$ that is substantially similar to $W_{MTJ1}$ to prevent etching of the dielectric spacer during a subsequent etch operation.

Figure 9B:
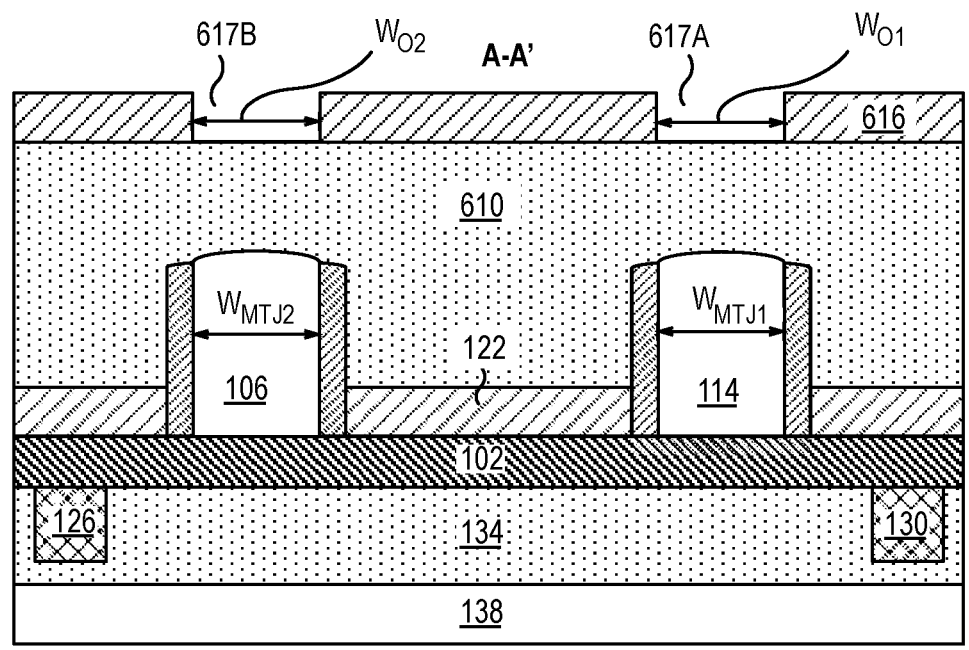
FIG. 9B illustrates a cross-sectional view orthogonal to the cross-sectional view of the structure in FIG. 9A.

FIG. 9B illustrates a cross-sectional view across a line A-A' through an axis of the structure of FIG. 9A. The cross-sectional view illustrates an opening 617B above the memory device 106. In the illustrative embodiment, the memory devices 106 and 114 and the openings the opening 617A and 617B each have a circular plan-view profile. In some such embodiments, opening 617A has a width, $W_{O1}$ that is substantially same as $W_{MTJ1}$ and opening 617B has a width, $W_{O2}$ that is substantially same as $W_{MTJ2}$.

Figure 10A:
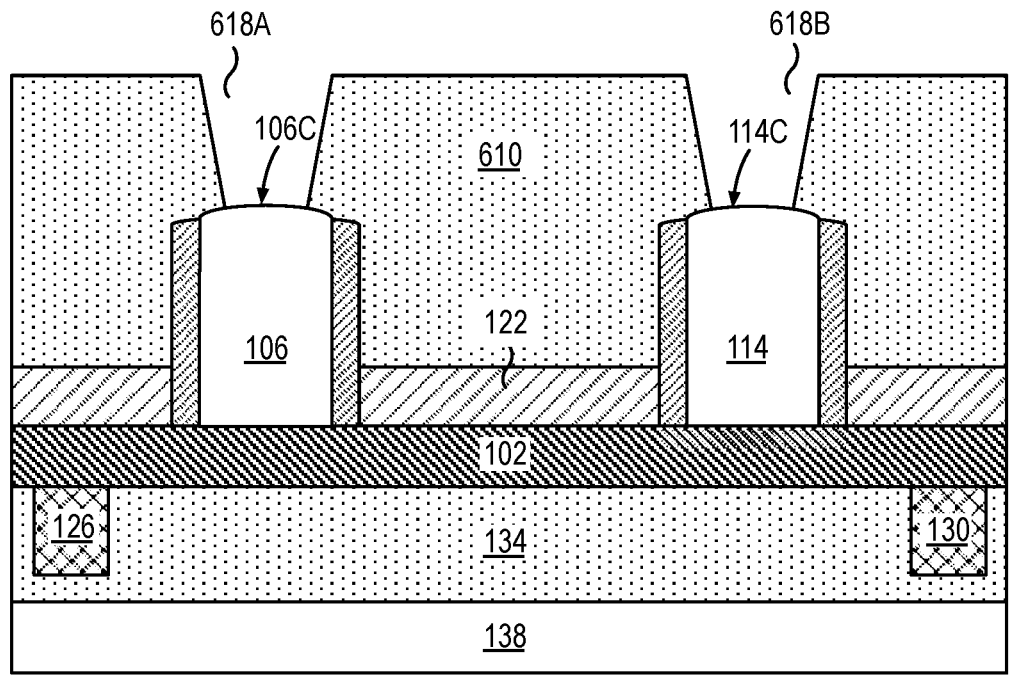
FIG. 10A illustrates a cross-sectional view orthogonal to the cross-sectional view of the structure in FIG. 9B, following the formation of a first opening above the first MTJ and a second opening above the second MTJ.

FIG. 10A illustrates a cross-sectional view orthogonal to the cross-sectional view of the structure in FIG. 9B, following the formation of a dielectric opening 618A to expose surface 114C of memory device 114 and a dielectric opening 618B to expose surface 106C of memory device 106. In the illustrative embodiment, the openings 618A and 618B are tapered to expose a portion of surfaces 106C and 114C, respectively. In other embodiments, the openings 618A and 618B expose entire portion of surfaces 106C and 114C.

Figure 10B:
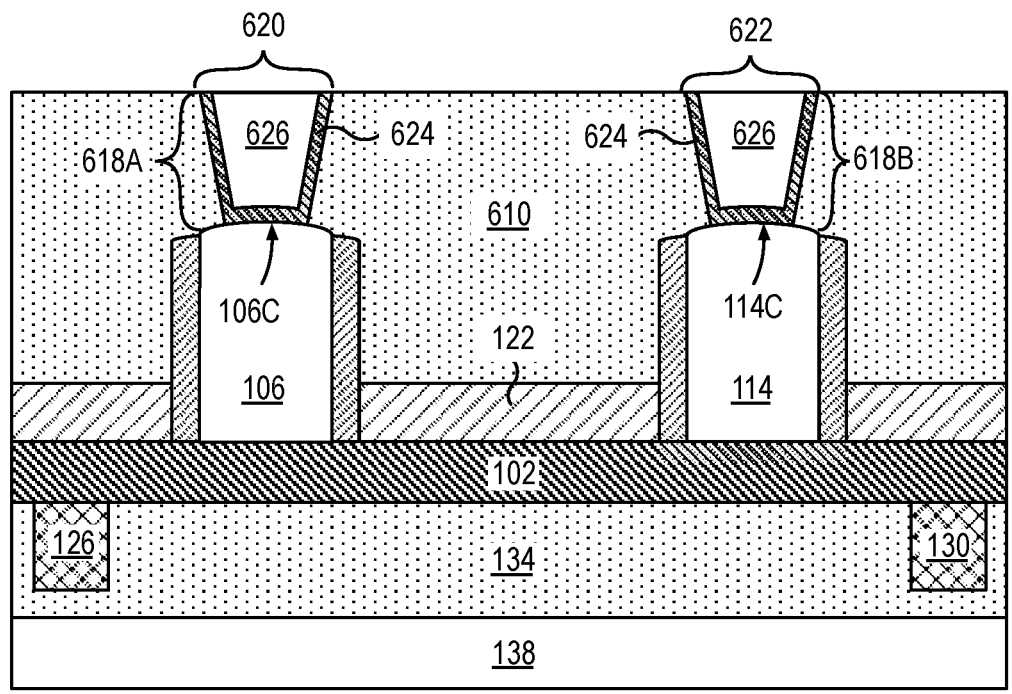
FIG. 10B illustrates a cross-sectional view of the structure in FIG. 10A, following the formation of a first conductive metallization adjacent to the first MTJ and a second conductive metallization adjacent to the second MTJ.

FIG. 10B illustrates a cross-sectional view of the structure in FIG. 10A, following the formation of a metallization structure 620 adjacent to the memory device 106 and a metallization structure 622 adjacent to the memory device 114.

In an embodiment, formation of the metallization structure 620 includes forming a barrier layer 624 in the opening 618B on the surface 106C and adjacent to sidewalls of dielectric 610. The barrier layer 624 is also deposited on uppermost surface of the dielectric 610. In the illustrative embodiment the barrier layer 624 is also blanket deposited in the opening 618B, on the surface 114C and adjacent to sidewalls of dielectric 610. The barrier layer 624 may include one or more of Ti, Al, Ru, Ni or Ta. In an embodiment, the barrier layer 624 is deposited using a plasma enhanced chemical vapor deposition (PECVD) or an ALD process.

The formation process is continued with deposition of a fill metal 626 on the barrier layer 624 in the opening 618A, on the barrier layer 624 above the dielectric 610 and on the barrier layer 624 in the opening 618B. The fill metal 626 may include one or more of Cu, Ni, TaN, Co, Mo or W. In an embodiment, the fill metal 626 is deposited using a plasma enhanced chemical vapor deposition (PECVD), electroplating or an ALD process.

In an embodiment, after the deposition process, the fill metal 626 and the barrier layer 624 above the dielectric 610 is removed by a planarization process. The planarization process isolates the metallization structure 620 from the metallization structure 622.

Figure 11:
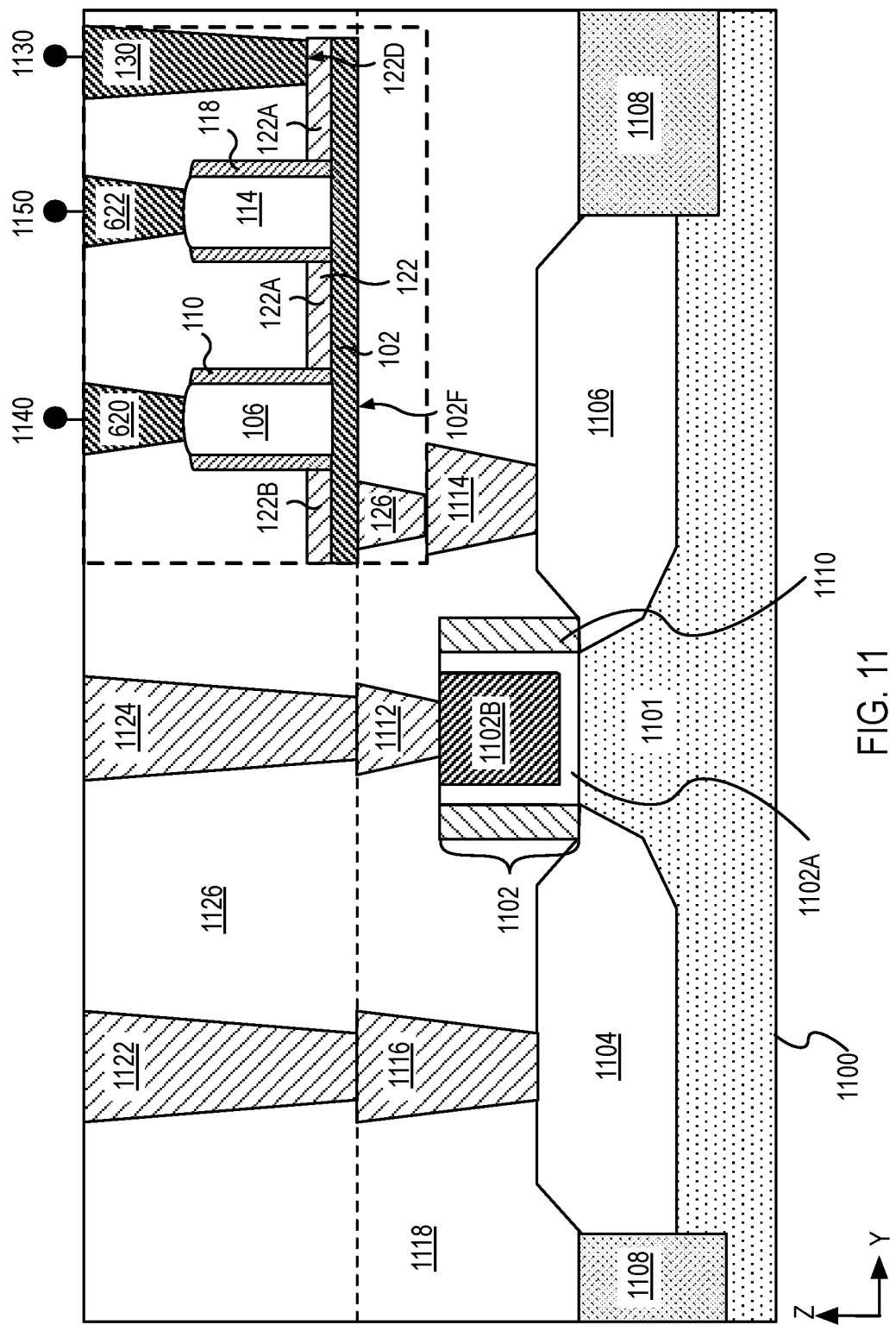
FIG. 11 illustrates a cross-sectional view of a memory array device coupled to a plurality of transistors, in accordance with an embodiment of the present disclosure.

FIG. 11 illustrates a multi-terminal memory apparatus such as memory apparatus 100 coupled to an access transistor 1100.

In an embodiment, the transistor 1100 is on a substrate 1101 and has a gate 1102, a source region 1104, and a drain region 1106. In the illustrative embodiment, an isolation 1108 is adjacent to the source region 1104, drain region 1106 and portions of the substrate 1101. In some implementations of the disclosure, such as is shown, a pair of sidewall spacers 1110 are on opposing sides of the gate 1102.

The transistor 1100 further includes a gate contact 1112 above and electrically coupled to the gate 1102, and a drain contact 1114 above and electrically coupled to the drain region 1106, and a source contact 1116 above and electrically coupled to the source region 1104, as is illustrated in FIG. 11. The transistor 1100 also includes dielectric 1118 adjacent to the gate 1102, source region 1104, drain region 1106, isolation 1108, sidewall spacers 1110, gate contact 1112, drain contact 1114 and source contact 1116.

Gate contact 1112 and source contact 1116 are each coupled with interconnects. In the illustrative embodiment, gate contact 1112 is coupled with a source interconnect 1122 and the source contact 1116 is coupled with a gate interconnect 1124. A dielectric 1126 is adjacent to source interconnect 1122, gate interconnect 1124, memory device apparatus 100, source contact 1116 and gate contact 1112.

In an embodiment, the memory apparatus 100 is a multi-terminal memory apparatus 100 (herein memory apparatus) with one or more structural and material properties described above in FIG. 1A. In the illustrative embodiment, the memory apparatus 100 includes a memory device 106 on a portion of the spin orbit electrode 102, and a dielectric spacer 110 adjacent to the memory device 106. The memory apparatus 100 further includes a memory device 114 on the spin orbit electrode 102, the memory device 114 is laterally distant from the memory device 106.

A dielectric spacer 118 is adjacent to the memory device 114 and is also on a portion of the spin orbit electrode 102. In the cross-sectional illustration, the dielectric spacer 118. The memory apparatus 100 further includes an electrode 122 on and in contact with a portion of the spin orbit electrode 102. As shown the electrode 122 has a portion 122A that is between the memory device 106 and the memory device 114.

An electrode portion 122B is also on a portion of the spin orbit electrode 102 and adjacent to spacer portion 110B as shown. The electrode 122 includes an electrode portion 122C that is on a portion of the spin orbit electrode 102 and adjacent to spacer portion 118B, also as shown. In an embodiment, the electrode 122 includes a material that has a lower electrical resistance than an electrical resistance of the spin orbit material. The memory apparatus further includes two interconnect structures that are coupled to the spin orbit electrode 102. Interconnect structure 126 is in contact with spin orbit electrode 102 and laterally distant from the memory device 106. A second interconnect structure 130 is in contact with spin orbit electrode 102 and is laterally distant from the memory device 114. In the illustrative embodiment, interconnect structure 126 is coupled with a lowermost surface 102F of the spin orbit electrode 102, above and with the drain contact 1114, below as shown. In the illustrative embodiment, the interconnect structure 130 is in contact with an uppermost surface 122F of the electrode 122. Voltage biasing between the interconnect structures 126 and 130 generates a spin Hall current in the spin orbit electrode 102 under the memory device 106 and memory device 114. Conductive interconnect 130 may be connected to a terminal of an external transistor 1130 to enable voltage biasing.

The metallization structure 620 is coupled with memory device 106, as shown. In an embodiment, metallization structure 620 is coupled with a transistor 1140 to enable read write operation in the memory device 106. The metallization structure 622 is coupled with memory device 114, as shown. In an embodiment, metallization structure 622 is coupled with a transistor 1140 to enable read write operation in the memory device 114.

In various embodiments, memory device 106 and 114 includes one or more embodiments of the memory device 106 device described in association with FIGS. 3A-3B.

In an embodiment, the underlying substrate 1101 represents a surface used to manufacture integrated circuits. Suitable substrate 1101 includes a material such as single crystal silicon, polycrystalline silicon and silicon on insulator (SOI), as well as substrates formed of other semiconductor materials. In some embodiments, the substrate 1101 is the same as or substantially the same as the substrate 1101. The substrate 1101 may also include semiconductor materials, metals, dielectrics, dopants, and other materials commonly found in semiconductor substrates.

In an embodiment, the transistor 1100 associated with substrate 1101 are metal-oxide-semiconductor field-effect transistors (MOSFET or simply MOS transistors), fabricated on the substrate 1101. In some embodiments, the transistor 1100 is an access transistor 1100. In various implementations of the disclosure, the transistor 1100 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In some embodiments, gate 1102 includes at least two layers, a gate dielectric layer 1102A and a gate electrode 1102B. The gate dielectric layer 1102A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 1102A to improve its quality when a high-k material is used.

The gate electrode 1102B of the access transistor 1100 of substrate 1101 is formed on the gate dielectric layer 1102A and may consist of at least one P-type work function metal or N-type work function metal, depending on whether the transistor is to be a PMOS or an NMOS transistor. In some implementations, the gate electrode 1102B may consist of a stack of two or more metal layers, where one or more metal layers are work function metal layers and at least one metal layer is a conductive fill layer.

For a PMOS transistor, metals that may be used for the gate electrode 1102B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, the gate electrode may consist of a "U"-shaped structure that includes a bottom portion substantially parallel to the surface of the substrate 1101 and two sidewall portions that are substantially perpendicular to a top surface of the substrate 1101. In another implementation, at least one of the metal layers that form the gate electrode 1102B may simply be a planar layer that is substantially parallel to the top surface of the substrate 1101 and does not include sidewall portions substantially perpendicular to the top surface of the substrate 1101. In further implementations of the disclosure, the gate electrode may consist of a combination of U-shaped structures and planar, non-U-shaped structures. For example, the gate electrode 1102B may consist of one or more U-shaped metal layers formed atop one or more planar, non-U-shaped layers.

The sidewall spacers 1110 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As shown, the source region 1104 and drain region 1106 are formed within the substrate 1101 adjacent to the gate stack of each MOS transistor. The source region 1104 and drain region 1106 are generally formed using either an implantation/diffusion process or an etching/deposition process. In the former process, dopants such as boron, aluminum, antimony, phosphorous, or arsenic may be ion-implanted into the substrate 1101 to form the source region 1104 and drain region 1106. An annealing process that activates the dopants and causes them to diffuse further into the substrate typically follows the ion implantation process. In the latter process, the substrate 1101 may first be etched to form recesses at the locations of the source and drain regions. An epitaxial deposition process may then be carried out to fill the recesses with material that is used to fabricate the source region 1104 and drain region 1106. In some implementations, the source region 1104 and drain region 1106 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 1104 and drain region 1106 may be formed using one or more alternate semiconductor materials such as germanium or a group III-V material or alloy. And in further embodiments, one or more layers of metal and/or metal alloys may be used to form the source region 1104 and drain region 1106.

In an embodiment, the source contact 1116, the drain contact 1114 and gate contact 1112 each include a multi-layer stack. In an embodiment, the multi-layer stack includes one or more distinct layers of metal such as a layer of Ti, Ru or Al and a conductive cap on the one or more distinct layers of metal. The conductive cap may include a material such as W, Co or Cu.

The isolation 1108 and dielectric 1118 and 1126 may each include any material that has sufficient dielectric strength to provide electrical isolation. The isolation 1108 and dielectric 1118 and 1126 may each include silicon and at least one of nitrogen, oxygen or carbon.

Figure 12:
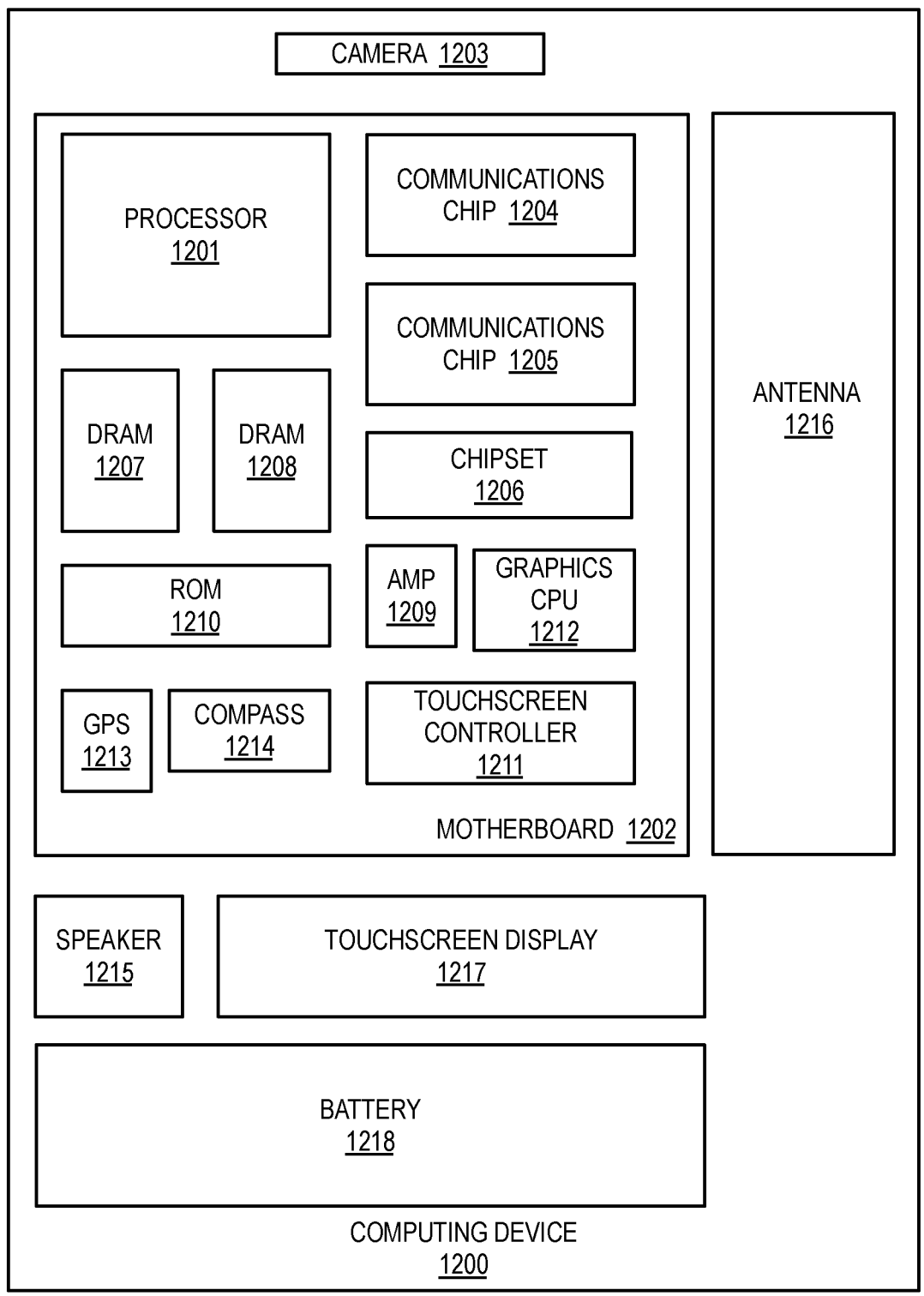
FIG. 12 illustrates a computing device in accordance with embodiments of the present disclosure.

FIG. 12 illustrates a computing device 1200 in accordance with embodiments of the present disclosure. As shown, computing device 1200 houses a motherboard 1202. Motherboard 1202 may include a number of components, including but not limited to a processor 1201 and at least one communications chip 1204 or 1205. Processor 1201 is physically and electrically coupled to the motherboard 1202. In some implementations, communications chip 1205 is also physically and electrically coupled to motherboard 1202. In further implementations, communications chip 1205 is part of processor 1201.

Depending on its applications, computing device 1200 may include other components that may or may not be physically and electrically coupled to motherboard 1202. These other components include, but are not limited to, volatile memory (e.g., DRAM), non-volatile memory (e.g., ROM), flash memory, a graphics processor, a digital signal processor, a crypto processor, a chipset 1206, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). In an embodiment, the battery is coupled to power at least one of the processor or the volatile or non-volatile memory.

Communications chip 1205 enables wireless communications for the transfer of data to and from computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 1205 may implement any of a number of wireless standards or protocols, including but not limited to Wi-Fi (IEEE 802.11 family), WiMAX (IEEE 802.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1200 may include a plurality of communications chips 1204 and 1205. For instance, a first communications chip 1205 may be dedicated to shorter range wireless communications such as Wi-Fi and Bluetooth and a second communications chip 1204 may be dedicated to longer range wireless communications such as GPS, EDGE, GPRS, CDMA, WiMAX, LTE, Ev-DO, and others.

Processor 1201 of the computing device 1200 includes an integrated circuit die packaged within processor 1201. In some embodiments, the integrated circuit die of processor 1201 includes one or more transistors, interconnect structures, non-volatile memory devices, conductive structures and metallization structures such as transistor 1100 coupled with memory apparatus 100 such as is described above in association with FIG. 11. Referring once again to FIG. 12, the term "processor" may refer to any device or portion of a device that processes electronic data from registers and/or memory to transform that electronic data into other electronic data that may be stored in registers and/or memory.

Communications chip 1205 also includes an integrated circuit die packaged within communication chip 1205. In another embodiment, the integrated circuit die of communications chips 1204, 1205 includes one or more one or more transistors, interconnect structures, non-volatile memory devices, conductive structures and metallization structures such as transistor 1100 coupled with memory apparatus 100 such as is described above in association with FIG. 11.

Referring once again to FIG. 12, depending on its applications, computing device 1200 may include other components that may or may not be physically and electrically coupled to motherboard 1202. These other components may include, but are not limited to, volatile memory (e.g., DRAM) 1207, 1208, non-volatile memory (e.g., ROM) 1210, a graphics CPU 1212, flash memory, global positioning system (GPS) device 1213, compass 1214, a chipset 1206, an antenna 1216, a power amplifier 1209, a touchscreen controller 1211, a touchscreen display 1217, a speaker 1215, a camera 1203, and a battery 1218, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 1200 and discussed above may contain a stand-alone integrated circuit memory die that includes one or more arrays of non-volatile memory devices including one or more memory apparatus 200A or 200B coupled with a plurality of transistors.

Referring once again to FIG. 12, in various implementations, the computing device 1200 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

Figure 13:
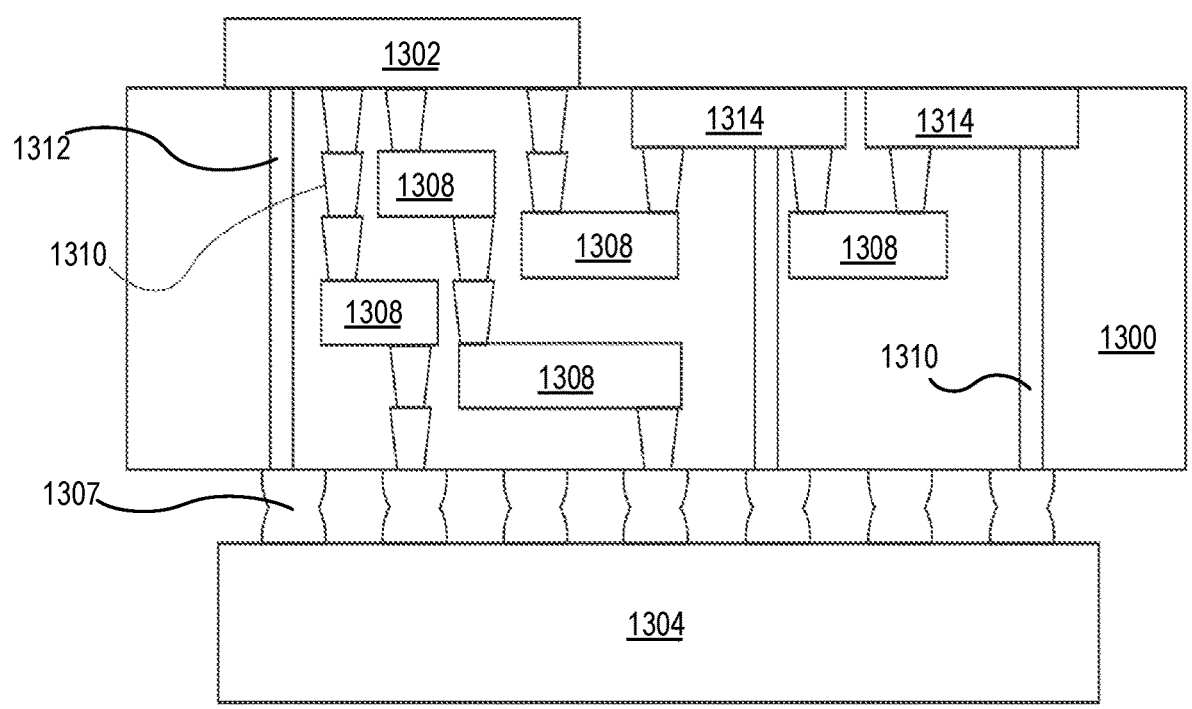
FIG. 13 illustrates an integrated circuit (IC) structure that includes one or more embodiments of the present disclosure.

FIG. 13 illustrates an integrated circuit (IC) structure 1300 that includes one or more embodiments of the disclosure. The integrated circuit (IC) structure 1300 is an intervening substrate used to bridge a first substrate 1302 to a second substrate 1304. The first substrate 1302 may be, for instance, an integrated circuit die. The second substrate 1304 may be, for instance, a memory module, a computer mother, or another integrated circuit die. Generally, the purpose of an integrated circuit (IC) structure 1300 is to spread a connection to a wider pitch or to reroute a connection to a different connection. For example, an integrated circuit (IC) structure 1300 may couple an integrated circuit die to a ball grid array (BGA) 1307 that can subsequently be coupled to the second substrate 1304. In some embodiments, the first and second substrates 1302/1304 are attached to opposing sides of the integrated circuit (IC) structure 1300. In other embodiments, the first and second substrates 1302/1304 are attached to the same side of the integrated circuit (IC) structure 1300. And in further embodiments, three or more substrates are interconnected by way of the integrated circuit (IC) structure 1300.

The integrated circuit (IC) structure 1300 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 1308 and vias 1310, including but not limited to through-silicon vias (TSVs) 1312. The integrated circuit (IC) structure 1300 may further include embedded devices 1314, including both passive and active devices. Such devices 1314 include, but are not limited to, capacitors, decoupling capacitors, resistors, inductors, fuses, diodes, transformers, device structure including transistors, such as transistors 1100, 1130, 1150 (described in FIG. 13) coupled with a with one at least one memory apparatus such as the memory apparatus 100 including a spin orbit electrode coupled with at least two memory devices, such as memory devices 106 and 114, in accordance with an embodiment of the present disclosure. Referring again to FIG. 13, the integrated circuit (IC) structure 1300 may further include embedded devices 1314 such as one or more resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 1300. In accordance with embodiments of the present disclosure, apparatuses or processes disclosed herein may be used in the fabrication of integrated circuit (IC) structure 1300.

Accordingly, one or more embodiments of the present disclosure relate generally to the fabrication of embedded microelectronic memory. The microelectronic memory may be non-volatile, wherein the memory can retain stored information even when not powered. One or more embodiments of the present disclosure relate to the fabrication of a memory apparatus such as the memory apparatus including a spin orbit electrode and least two memory devices (including magnetic tunnel junctions) on the spin orbit electrode. The memory apparatus described above may be used in an embedded non-volatile memory application.

In a first example, a memory apparatus includes a first electrode with a spin orbit material. The memory apparatus further includes a first memory device on a portion of the first electrode and a first dielectric adjacent to a sidewall of the first memory device and on a portion of the first electrode. The memory apparatus further includes a second memory device on a portion of the first electrode and a second dielectric adjacent to a sidewall of the second memory device and on a portion of the first electrode. The second memory device is laterally spaced from the first memory device along a length of the first electrode. A second electrode is on and in contact with a portion of the first electrode, where the second electrode is between the first memory device and the second memory device. The second electrode includes a lower electrical resistance than an electrical resistance of the first electrode. The memory apparatus further includes a first interconnect structure and a second interconnect, each coupled with the first electrode, where the first memory device and the second memory device are each laterally between the first interconnect structure and the second interconnect structure.

In second examples, for any of the first example, the first electrode has a thickness between 2 nm and 20 nm, where the thickness is measured from a lowermost surface of the second electrode.

In third examples, for any of the first through second examples, the second electrode includes tantalum, tungsten or platinum.

In fourth examples, for any of the first through third examples, the second electrode has a vertical thickness between 2 nm and 20 nm, where the vertical thickness is measured from an uppermost surface of the first electrode.

In fifth examples, for any of the first through fourth examples, the second electrode has a thickness between the first memory device and the second memory device that varies by less than 2 percent.

In sixth examples, for any of the first through fifth examples, the first electrode adjacent the first memory device has a first dimension along a first direction, where the first memory device has a second dimension along the first direction, where the first dielectric has a third dimension along the first direction, and where the first dimension is substantially equal to the second dimension plus two times the third dimension.

In seventh examples, for any of the first through sixth examples, the first dimension is between 20 nm and 100 nm where the second dimension is between 10 nm and 75 nm and where the third dimension is between 2 nm and 10 nm.

In eighth examples, for any of the first through seventh examples, the first electrode adjacent the second memory device has the first dimension along the first direction, the second memory device has the second dimension along the first direction, and the second dielectric has the third dimension along the first direction, and where the first dimension is substantially equal to the second dimension plus two times the third dimension.

In ninth examples, for any of the first through eighth examples, the first dimension is between 20 nm and 100 nm, where the second dimension is between 10 nm and 75 nm and the third dimension is between 2 nm and 10 nm.

In tenth examples, for any of the first through ninth examples, the first dielectric laterally surrounds the first memory device and the second dielectric laterally surrounds the second memory device.

In eleventh examples, for any of the first through tenth examples, the first electrode has a fourth dimension along a first direction, where the first memory device has the fourth dimension and the second memory device has the fourth dimension.

In twelfth examples, for any of the first through eleventh examples, the second electrode has a fifth dimension along the first direction, where the fifth dimension is substantially equal to the first dimension.

In a thirteenth example, for any of the first through twelfth examples, the first memory device includes a first magnetic tunnel junction. The first magnetic tunnel junction includes a first layer including a first magnetic material and a first magnetization, a second layer including a second magnetic material and a second magnetization above the first layer and a second layer between first layer and the second layer. The second memory device includes a second magnetic tunnel junction. The second magnetic tunnel junction includes a fourth layer including the first magnetic material and the first magnetization, a fifth layer including the second magnetic material and the second magnetization above the fourth layer and a sixth layer between fourth layer and the fifth layer.

In fourteenth examples, a memory apparatus includes first electrode including a spin orbit material, where the first electrode has a first dimension along a first direction and a first magnetic tunnel junction on a portion of the first electrode where the first magnetic tunnel junction has the first dimension along the first direction. A first dielectric is adjacent to a sidewall of the first magnetic tunnel junction and on a portion of the first electrode. The memory apparatus further includes a second magnetic tunnel junction on the first electrode, where the second magnetic tunnel junction is laterally distant from the first magnetic tunnel junction, and where the second magnetic tunnel junction has the first dimension along the first direction. A second dielectric is adjacent to a sidewall of the second magnetic tunnel junction and on a portion of the first electrode. A second electrode is on and in contact with a portion of the first electrode, where the second electrode is between the first memory device and the second memory device, where the second electrode includes a material having a lower electrical resistance than an electrical resistance of the spin orbit material and where the second electrode has the first dimension along the first direction. The memory apparatus further includes a first interconnect structure coupled with the first electrode and a second interconnect coupled with the first electrode, where the first memory device and the second memory device are each laterally between the first interconnect structure and the second interconnect structure.

In fifteenth examples, for any of the fourteenth example, the first electrode has a first vertical thickness as measured from a lowermost surface of the second electrode, where the second electrode has a second vertical thickness as measured from an uppermost surface of the first electrode, and where the second vertical thickness is between 1.5 and 10 times the first vertical thickness.

In sixteenth examples, for any of the fourteenth through fifteenth examples, he first dielectric does not laterally surround the first magnetic tunnel junction and the second dielectric does not laterally surround the first magnetic tunnel junction.

In seventeenth examples, for any of the fourteenth through sixteenth examples, the first dielectric does not laterally surround the first magnetic tunnel junction and the second dielectric does not laterally surround the first magnetic tunnel junction.

In eighteenth examples, for any of the fourteenth through seventeenth examples, the first memory device includes a first magnetic tunnel junction. The first magnetic tunnel junction includes a first layer including a first magnetic material and a first magnetization, a second layer including a second magnetic material and a second magnetization above the first layer and a second layer between first layer and the second layer. The second memory device includes a second magnetic tunnel junction. The second magnetic tunnel junction includes a fourth layer including the first magnetic material and the first magnetization, a fifth layer including the second magnetic material and the second magnetization above the fourth layer and a sixth layer between fourth layer and the fifth layer.

In a nineteenth example, system includes a processor, a radio transceiver coupled to the processor, where the transceiver includes a transistor. The transistor includes a drain contact coupled to a drain, a source contact coupled to a source and a gate contact coupled to a gate. The radio transceiver further includes a memory apparatus, coupled with the drain contact. The memory apparatus includes a first electrode with a spin orbit material. The memory apparatus further includes a first memory device on a portion of the first electrode and a first dielectric adjacent to a sidewall of the first memory device and on a portion of the first electrode. The memory apparatus further includes a second memory device on a portion of the first electrode and a second dielectric adjacent to a sidewall of the second memory device and on a portion of the first electrode. The second memory device is laterally spaced from the first memory device along a length of the first electrode. A second electrode is on and in contact with a portion of the first electrode, where the second electrode is between the first memory device and the second memory device. The second electrode includes a lower electrical resistance than an electrical resistance of the first electrode. The memory apparatus further includes a first interconnect structure and a second interconnect, each coupled with the first electrode, where the first memory device and the second memory device are each laterally between the first interconnect structure and the second interconnect structure.

In twentieth example, for any of the nineteenth example, the system further includes a battery coupled to power at least one of the processor or memory.

What is claimed is:

1. An apparatus, comprising:
a first electrode comprising a spin orbit material;
a first memory device on a first portion of the first electrode;
a first dielectric adjacent to a sidewall of the first memory device and on a second portion of the first electrode;
a second memory device on a third portion of the first electrode, the second memory device laterally distant from the first memory device;
a second dielectric adjacent to a sidewall of the second memory device and on a fourth portion of the first electrode; and
a second electrode on and in contact with a fifth portion of the first electrode, the second electrode laterally between the first memory device and the second memory device, wherein the second electrode comprises a lower electrical resistance than an electrical resistance of the first electrode;
a first interconnect structure coupled with the first electrode; and
a second interconnect structure coupled with the first electrode,
wherein each of the first memory device, the second memory device, and the second electrode are above the first electrode.

2. The apparatus of claim 1, wherein the first electrode has a thickness between 2 nm and 20 nm, wherein the thickness is measured from a lowermost surface of the second electrode.

3. The apparatus of claim 1, wherein the second electrode includes tantalum, titanium, tungsten or platinum.

4. The apparatus of claim 1, wherein the second electrode has a vertical thickness between 2 nm and 20 nm, wherein the vertical thickness is measured from an uppermost surface of the first electrode.

5. The apparatus of claim 4, wherein the second electrode has a thickness between the first memory device and the second memory device that varies by less than 2 percent.

6. The apparatus of claim 1, wherein the first electrode adjacent the first memory device has a first dimension along a first direction, wherein the first memory device has a second dimension along the first direction, wherein the first dielectric has a third dimension along the first direction, and wherein the first dimension is substantially equal to the second dimension plus two times the third dimension.

7. The apparatus of claim 6, wherein the first dimension is between 20 nm and 100 nm wherein the second dimension is between 10 nm and 75 nm and wherein the third dimension is between 2 nm and 10 nm.

8. The apparatus of claim 6, wherein the second electrode has a fifth dimension along the first direction, wherein the fifth dimension is substantially equal to the first dimension.

9. The apparatus of claim 1, wherein the first electrode adjacent the second memory device has the first dimension along the first direction, the second memory device has the second dimension along the first direction, and the second dielectric has the third dimension along the first direction, and wherein the first dimension is substantially equal to the second dimension plus two times the third dimension.

10. The apparatus of claim 9, wherein the first dimension is between 20 nm and 100 nm, wherein the second dimension is between 10 nm and 75 nm and the third dimension is between 2 nm and 10 nm.

11. The apparatus of claim 1, wherein the first dielectric laterally surrounds the first memory device and the second dielectric laterally surrounds the second memory device, and wherein the first electrode has a fourth dimension along a first direction, wherein the first memory device has the fourth dimension and the second memory device has the fourth dimension.

12. The apparatus of claim 1, wherein the first memory device comprises a first magnetic tunnel junction, comprising:
a first layer comprising a first magnetic material and a first magnetization;
a second layer comprising a second magnetic material and a second magnetization above the first layer; and
a second layer between first layer and the second layer; and
wherein the second memory device comprises a second magnetic tunnel junction, comprising:
a fourth layer comprising the first magnetic material and the first magnetization;

a fifth layer comprising the second magnetic material and the second magnetization above the fourth layer; and a sixth layer between fourth layer and the fifth layer.

13. The apparatus of claim 1, wherein the first electrode has a first vertical thickness as measured from a lowermost surface of the second electrode, wherein the second electrode has a second vertical thickness as measured from an uppermost surface of the first electrode, and wherein the second vertical thickness is between 1.5 and 10 times the first vertical thickness.

14. The apparatus of claim 1, wherein the first dielectric does not laterally surround the first magnetic tunnel junction and the second dielectric does not laterally surround the first magnetic tunnel junction.

15. The apparatus of claim 1, wherein a third dielectric is adjacent to a portion of the first magnetic tunnel junction and adjacent to a portion of the second magnetic tunnel junction and the second dielectric and wherein the third dielectric comprises a material that is substantially similar to a material of the first dielectric and the second dielectric.

16. The apparatus of claim 1, wherein the first memory device comprises a first magnetic tunnel junction, comprising:
- a first layer comprising a first magnetic material and a first magnetization;
- a second layer comprising a second magnetic material and a second magnetization above the first layer; and
- a second layer between first layer and the second layer; and wherein the second memory device comprises a second magnetic tunnel junction, comprising:
- a fourth layer comprising the first magnetic material and the first magnetization;
- a fifth layer comprising the second magnetic material and the second magnetization above the fourth layer; and
- a sixth layer between fourth layer and the fifth layer.

17. The apparatus of claim 1, wherein the first memory device and the second memory device are each laterally between the first interconnect structure and the second interconnect structure.

18. An apparatus, comprising:
- a first electrode comprising a spin orbit material, wherein the first electrode has a first dimension along a first direction;
- a first magnetic tunnel junction on the first electrode, wherein the first magnetic tunnel junction has the first dimension along the first direction;
- a first dielectric adjacent to a sidewall of the first magnetic tunnel junction and on the first electrode;
- a second magnetic tunnel junction on the first electrode, the second magnetic tunnel junction laterally distant from the first magnetic tunnel junction, wherein the second magnetic tunnel junction has the first dimension along the first direction;
- a second dielectric adjacent to a sidewall of the second magnetic tunnel junction and on the first electrode; and
- a second electrode on and in contact with the first electrode, the second electrode laterally between the first magnetic tunnel junction and the second magnetic tunnel junction, wherein the second electrode comprises a material having a lower electrical resistance than an electrical resistance of the spin orbit material, wherein the second electrode has the first dimension along the first direction,
  wherein the first magnetic tunnel junction, the second magnetic tunnel junction, and the second electrode are all on a same side of the first electrode;
- a first interconnect structure coupled with the first electrode; and
- a second interconnect structure coupled with the first electrode.

19. A system comprising:
- a processor;
- a radio transceiver coupled to the processor, wherein the transceiver comprises:
  - a transistor comprising:
    - a drain contact coupled to a drain;
    - a source contact coupled to a source; and
    - a gate contact coupled to a gate; and
  - a memory apparatus, coupled with the drain contact, the memory apparatus comprising:
    - a first interconnect structure coupled with the drain contact;
    - a first electrode comprising a spin orbit material directly adjacent to the first interconnect;
    - a first memory device on the first electrode, wherein the first memory device is laterally distant from the first interconnect structure;
    - a first dielectric adjacent to a sidewall of the first memory device and on the first electrode;
    - a second memory device on the first electrode, the second memory device laterally distant from the first memory device;
    - a second dielectric adjacent to a sidewall of the second memory device and on the first electrode;
    - a second electrode on and in contact with the first electrode, the second electrode laterally between the first memory device and the second memory device, wherein the second electrode comprises a material having a lower electrical resistance than an electrical resistance of the spin orbit material; and
    - a second interconnect structure coupled with the second electrode.

20. The system of claim 19, further comprising a battery coupled to power at least one of the processor or memory.

* * * * *